(12) United States Patent
Park et al.

(10) Patent No.: US 8,901,750 B2
(45) Date of Patent: Dec. 2, 2014

(54) SEMICONDUCTOR PACKAGE INCLUDING MULTIPLE CHIPS AND SEPARATE GROUPS OF LEADS

(71) Applicant: Samsung Electronics Co., Ltd., Suwon-si, Gyeonggi-do (KR)

(72) Inventors: Chul Park, Hwaseon-si (KR); Hyeong-seob Kim, Cheonan-si (KR); Kun-dae Yeom, Cheonan-si (KR); Gwang-man Lim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/250,934

(22) Filed: Apr. 11, 2014

(65) Prior Publication Data

US 2014/0225281 A1   Aug. 14, 2014

Related U.S. Application Data

(63) Continuation of application No. 13/465,387, filed on May 7, 2012, now Pat. No. 8,723,333, which is a continuation of application No. 12/630,363, filed on Dec. 3, 2009, now Pat. No. 8,193,626.

(30) Foreign Application Priority Data

Mar. 17, 2009  (KR) .................. 10-2009-0022747

(51) Int. Cl.
  *H01L 23/02*   (2006.01)
  *H01L 23/535*  (2006.01)
  *H01L 23/495*  (2006.01)
  *H01L 23/50*   (2006.01)
  *H01L 25/065*  (2006.01)
  *H01L 23/00*   (2006.01)

(52) U.S. Cl.
  CPC ........ *H01L 23/535* (2013.01); *H01L 23/49575* (2013.01); *H01L 23/50* (2013.01); *H01L 25/0657* (2013.01); *H01L 24/48* (2013.01); *H01L 24/49* (2013.01); *H01L 2224/48095* (2013.01); *H01L 2224/48145* (2013.01); *H01L 2224/48247* (2013.01); *H01L 2224/4911* (2013.01); *H01L 2224/49175* (2013.01); *H01L 2224/73265* (2013.01); *H01L 2224/83191* (2013.01); *H01L 2225/06562* (2013.01); *H01L 2924/01005* (2013.01); *H01L 2924/01027* (2013.01); *H01L 2924/01075* (2013.01); *H01L 2224/32145* (2013.01); *H01L 2224/32245* (2013.01)
  USPC .................... 257/777; 257/686; 257/E23.025

(58) Field of Classification Search
  USPC ........... 257/686, 777, 723, E23.141, E23.025
  See application file for complete search history.

(56) References Cited

U.S. PATENT DOCUMENTS 5,512,783 A  4/1996  Wakefield et al.
5,808,877 A  9/1998  Jeong et al.
(Continued)

FOREIGN PATENT DOCUMENTS

JP     58-184735    10/1983
JP    2002-231882    8/2002
(Continued)

OTHER PUBLICATIONS

Office Action dated Jun. 4, 2008 for related Application No. 10-2007-0060687.

*Primary Examiner* — Roy Potter
(74) *Attorney, Agent, or Firm* — F. Chau & Associates, LLC

(57) ABSTRACT

Provided is a semiconductor package including multiple semiconductor chips, and separate groups of leads connected to the semiconductor chips. The leads are exposed to the outside of the semiconductor package. The plurality of leads may include a first lead group for a first chip group and a second lead group for a second chip group. The first and second chip groups are part of the package.

20 Claims, 25 Drawing Sheets

(56) References Cited

U.S. PATENT DOCUMENTS

| | | |
|---|---|---|
| 6,252,305 B1 | 6/2001 | Lin et al. |
| 6,353,265 B1 | 3/2002 | Michii |
| 6,433,421 B2 | 8/2002 | Masuda et al. |
| 6,438,015 B2 | 8/2002 | Kyung |
| 6,650,008 B2 | 11/2003 | Tsai et al. |
| 6,900,528 B2 | 5/2005 | Mess et al. |
| 7,592,691 B2 | 9/2009 | Corisis et al. |
| 7,745,932 B2 | 6/2010 | Ko et al. |
| 7,928,551 B2 | 4/2011 | Fujiwara et al. |
| 2006/0267173 A1 | 11/2006 | Takiar et al. |
| 2008/0054432 A1 | 3/2008 | Corisis et al. |
| 2011/0037158 A1 | 2/2011 | Youn et al. |

FOREIGN PATENT DOCUMENTS

| | | |
|---|---|---|
| JP | 2005-150459 | 6/2005 |
| KR | 2002-0052693 | 7/2002 |
| KR | 2005-0069392 | 8/2004 |
| KR | 2004-0049346 | 5/2005 |

SEMICONDUCTOR PACKAGE INCLUDING MULTIPLE CHIPS AND SEPARATE GROUPS OF LEADS

CROSS REFERENCE TO RELATED APPLICATIONS

This application claims the benefit of priority as a continuation of U.S. patent application Ser. No. 13/465,387, filed on May 7, 2012, (now U.S. Pat. No. 8,723,333), which is a continuation of U.S. patent application Ser. No. 12/630,363 filed on Dec. 3, 2009, now U.S. Pat. No. 8,193,626, issued on Jun. 5, 2012, which claims priority under 35 U.S.C. Section 119 to Korean Patent Application No. 10-2009-0022747, filed on Mar. 17, 2009, in the Korean Intellectual Property Office, the disclosure of which is incorporated herein by reference in its entirety. This application is also related to U.S. patent application Ser. No. 12/153,558, filed on May 21, 2008, now U.S. Pat. No. 7,745,932, issued on Jun. 29, 2010, and Korean Patent Application No. 10-2007-0060687, filed on Jun. 20, 2007, the disclosures of each being incorporated by reference in their entirety. The disclosures of each of the above-referenced applications are hereby incorporated herein in their entireties by reference.

TECHNICAL FIELD OF THE DISCLOSURE

This US patent application relates in general to the art of semiconductor packages, and more particularly, to electrical connections in semiconductor packages having multiple semiconductor chips.

BACKGROUND OF THE DISCLOSURE

Semiconductor packages have been continuously developed to have increased integration degree and operating speed and to become thinner, lighter, and smaller. In general, a semiconductor package is manufactured by attaching one or more semiconductor chips onto a die pad, performing wire bonding on pads and leads formed on each of the semiconductor chips, and sealing the resultant structure by using an encapsulant, such as an epoxy molding compound (EMC). Flash memory may be packaged in thin small outline packages (TSOPs), which are relatively thin, as well as multi chip packages (MCPs), which are made by stacking two or more semiconductor chips when a single semiconductor chip is insufficient.

In the case of a semiconductor package that has a stacked structure of semiconductor chips, the semiconductor package is considered defective even when only one semiconductor chip is defective from among all the semiconductor chips in the semiconductor package. Because a single group of lead pins or other package terminals are used by all of the semiconductor chips in the semiconductor package, a defect in one chip or elsewhere in the package (e.g., contact of neighboring who bonds) may affect all the semiconductor chips of that group.

In the case of a semiconductor package with leads of a single group, at least one semiconductor package is necessary for each channel of a controller, and thus, it is impossible to reduce the total number of semiconductor packages mounted, on a substrate.

Also, in the case of a semiconductor package with leads of a single group, the number of input/output leads is limited; and the semiconductor packages may be connected serially to each connection channel provided by the controller, and thus it is difficult to improve the speed of inputting/outputting data.

SUMMARY

In one example, this disclosure provides a semiconductor package having leads that are categorized into a plurality of lead groups and having semiconductor chip groups corresponding to the lead groups, so that a semiconductor package that even includes a defective semiconductor chip can still be used as a normal semiconductor package. Thus, it is possible to increase packaging yield, to reduce a space necessary for mounting semiconductor packages by reducing the total number of semiconductor packages to be connected to a controller, and to fabricate a high-density semiconductor package, thereby saving manufacturing costs.

In another example, this disclosure provides a semiconductor package, in which leads of multiple lead groups are connected in parallel to the same channel of a controller in order to greatly increasing the speed of inputting/outputting data and the performance of the product, and all four side surfaces, i.e., left, right, front and rear side surfaces, of which may be used.

In yet another example, disclosed herein is a semiconductor package including a semiconductor chip; and a plurality of lead connected to the semiconductor chip and exposed to the outside. The plurality of leads includes a first lead group exposed in a direction corresponding to one side of the semiconductor chip and connected to a first channel line of a controller; and a second lead group exposed in a direction corresponding to another side of the semiconductor chip and connected to a second channel line of the controller.

In yet another example, a plurality of semiconductor chips are included in a first semiconductor chip group connected to the first lead group; and a second, semiconductor chip group connected to the second lead group.

In the first semiconductor chip group, a plurality of the semiconductor chips is stacked on a die pad in a stepwise fashion, and in the second semiconductor chip group, a plurality of the semiconductor chips is stacked below the die pad in a stepwise fashion.

Some of the plurality of the semiconductor chips can be mounted on a die pad, and some of the plurality of the semiconductor chips may be mounted to extend to the plurality of leads.

The leads of the second lead group may include the same lead arrangement as the leads of the first lead group. Each one of the first and second lead groups preferably, though not required, include leads connected to the semiconductor chip pins of an I/O pin, an NC pin, an R/B pin, a CE pin, a Vcc pin, a Vss pin, and a Wp pin.

In yet another example, disclosed herein is a semiconductor package including a semiconductor chip; and a plurality of leads connected to the semiconductor chip and exposed to the outside. The plurality of leads include a first lead group exposed in a direction corresponding to one side of the semiconductor chip and connected to a first channel line of a controller; and a second lead group exposed in a direction corresponding to another side of the semiconductor chip and connected in parallel to the first channel line of the controller.

In yet another example, provided herein is a semiconductor package including a semiconductor chip; and a plurality of leads connected to the semiconductor chip and exposed to the outside. The plurality of leads includes a first lead group exposed on a left side of the semiconductor chip and connected to a first channel line of a controller; a second lead group exposed on the right side of the semiconductor chip and connected to a second channel line of the controller; a third lead group exposed on a front side of the semiconductor chip and connected to a third channel line of the controller; and a fourth lead group exposed on a rear side of the semiconductor chip and connected to a fourth channel line of the controller.

A plurality of semiconductor chips of a semiconductor package may include a first semiconductor chip group connected to leads of the first lead group of the semiconductor package; a second semiconductor chip group connected to the leads of the second lead group; a third semiconductor chip group connected to the leads of the third lead group; and a fourth semiconductor chip group connected to the leads of the fourth lead group. In the first semiconductor chip group, the semiconductor chips may be stacked on a die pad in a first-direction stepwise fashion. In the second semiconductor chip group, the semiconductor chips may be stacked on the first semiconductor chip group in a second-direction stepwise fashion. In the third semiconductor chip group, the semiconductor chips may be stacked below the die pad in a third-direction stepwise fashion. In the fourth semiconductor chip group, the semiconductor chips may be stacked below the third semiconductor chip group in a fourth-direction stepwise fashion.

In the first semiconductor chip group, the semiconductor chips may be stacked on a die pad in a first-direction stepwise fashion. In the second semiconductor chip group, a plurality of the semiconductor chips may be stacked on the first semiconductor chip group in a second-direction stepwise fashion. In the third semiconductor chip group, a plurality of the semiconductor chips may be stacked on the second semiconductor chip group in a third-direction stepwise fashion. In the fourth semiconductor chip group, a plurality of the semiconductor chips may be stacked on the third semiconductor chip group in a fourth-direction stepwise fashion.

Rather than leads, terminals of the exemplary packages may be bumps or solder balls, rather than leads.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF SELECTED EXAMPLES

Hereinafter, selected examples of semiconductor packages and electrical connections implemented therein will be described in detail with reference to the accompanying drawings. It will be appreciated by those skilled in the art that the following discussion is for demonstration purposes, and should not be interpreted as a limitation. Other variances within the scope of this disclosure are also applicable.

Figure 1:
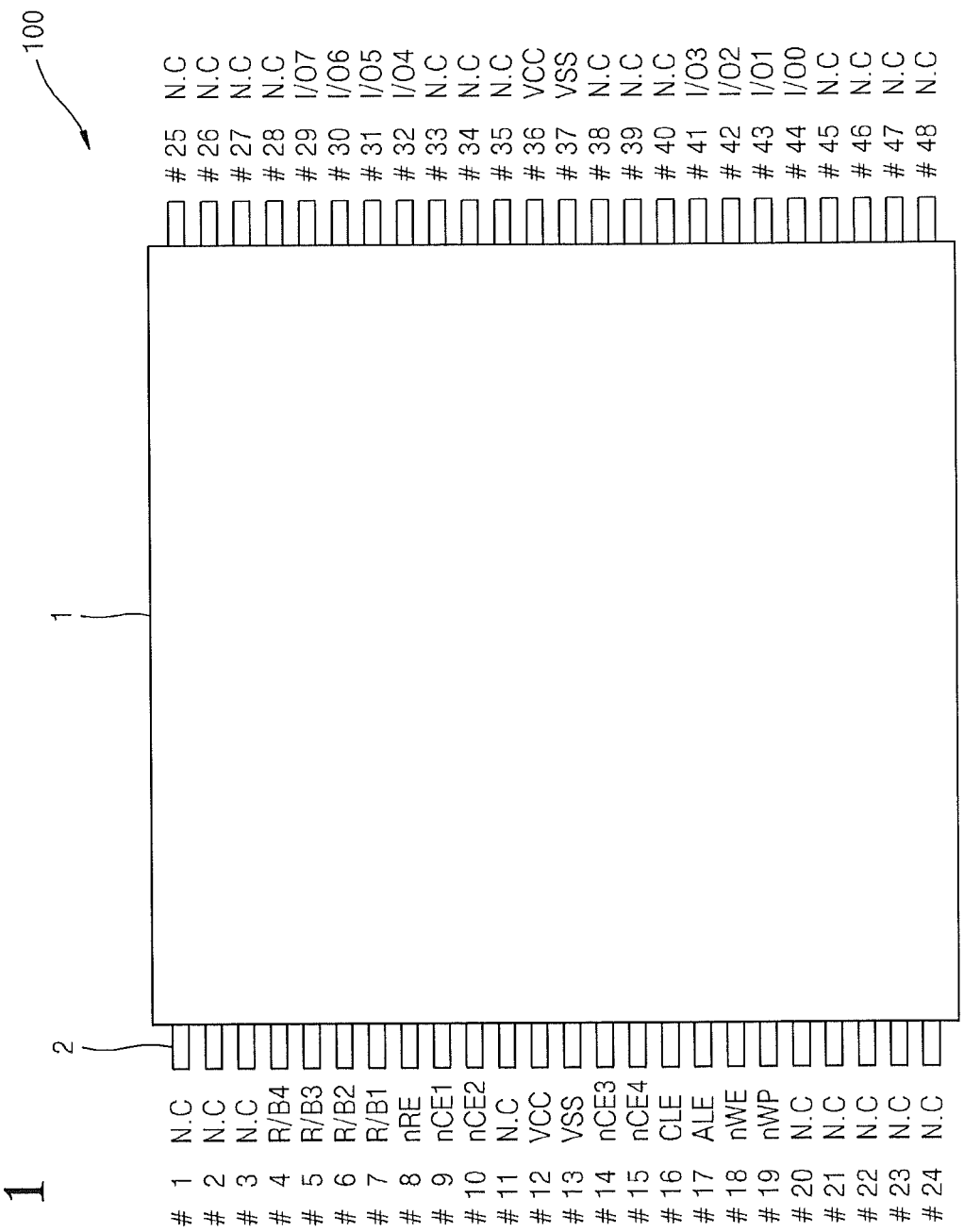
FIG. 1 is a plane view of the lead arrangement of a semiconductor package having only one lead group, according to a comparative example of the disclosure.
Figure 2:
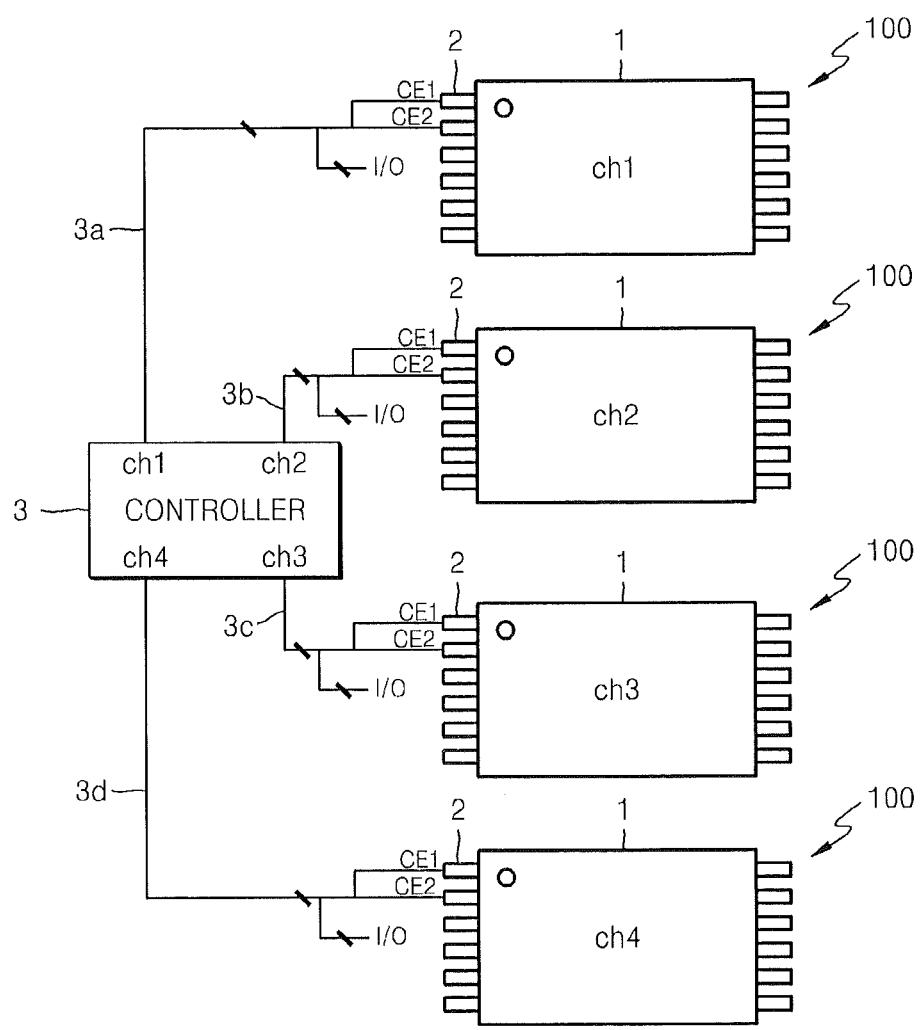
FIG. 2 is a conceptual diagram illustrating a case where semiconductor packages such as shown in FIG. 1 are connected to a four-channel controller.

FIG. 1 is a plane view of the pin arrangement of a semiconductor package 100 having only one pin group, according to one example. FIG. 2 is a conceptual diagram illustrating a case where the semiconductor packages 100, such as shown in FIG. 1, are connected to a four-channel controller 3, according to another example, FIG. 3 is a conceptual diagram illustrating another example where the semiconductor packages 100, such as shown in FIG. 1, are connected to an eight-channel controller 3.

Figure 3:
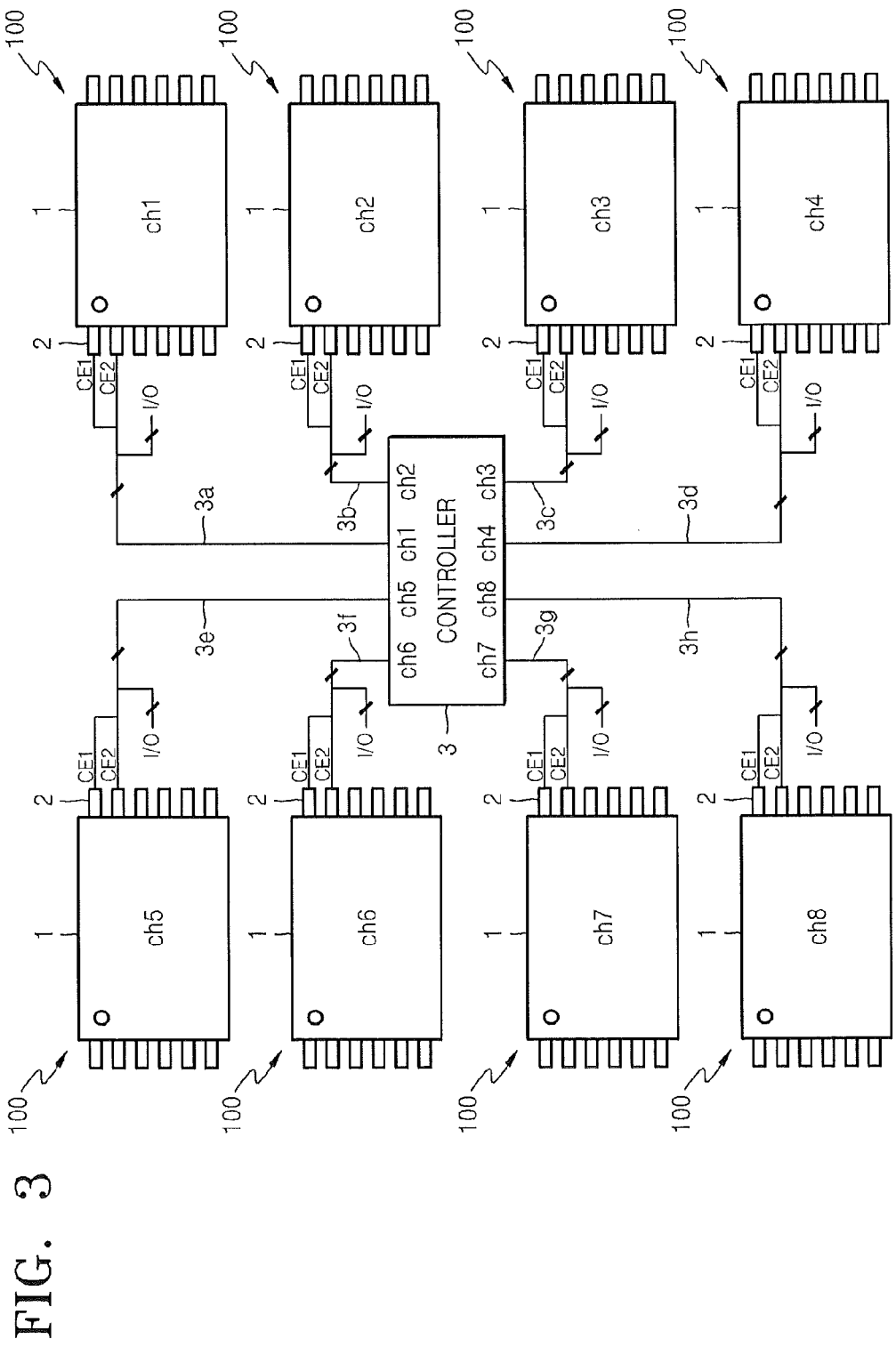
FIG. 3 is a diagram illustrating a case where semiconductor packages such as shown in FIG. 1 are connected to an eight-channel controller.
Figure 21:
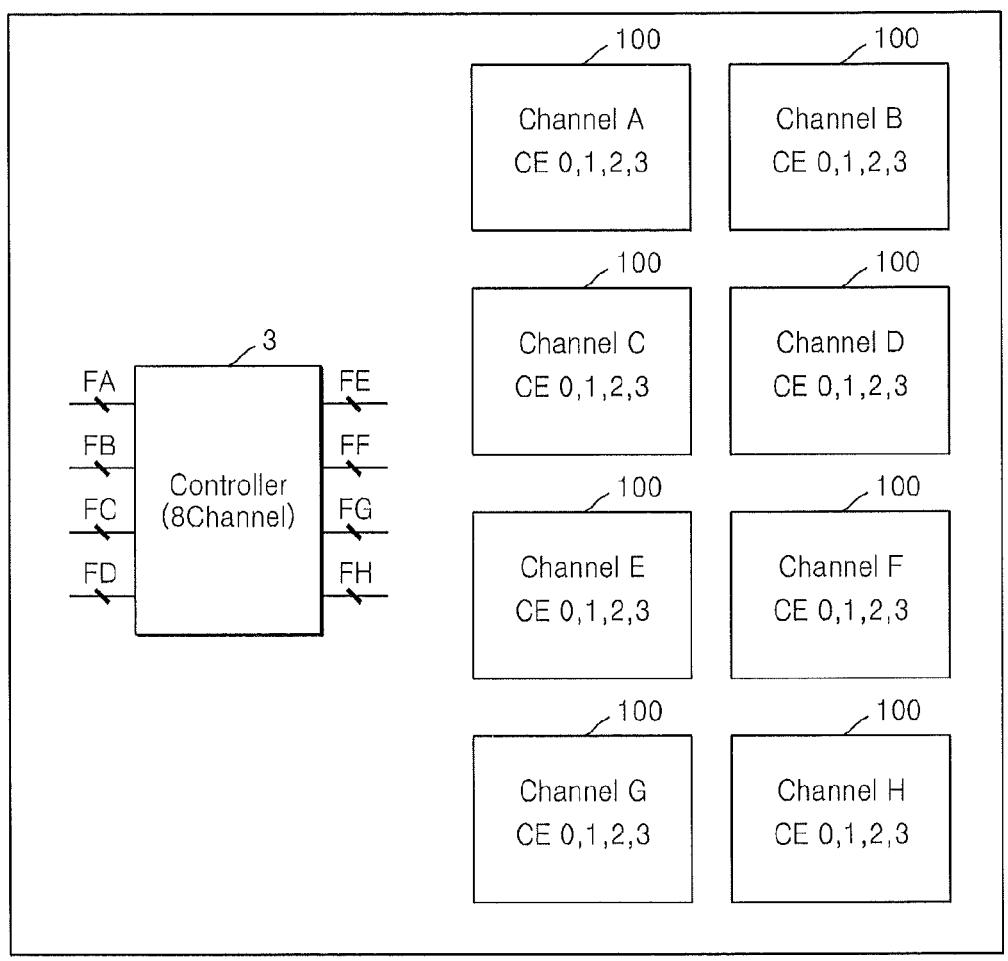
FIG. 21 is a diagram illustrating a case where eight semiconductor packages such as shown in FIG. 1 are necessary to drive an eight-channel controller when each of the semiconductor packages has only one lead group, according to yet another comparative example of the disclosure.
Figure 23:
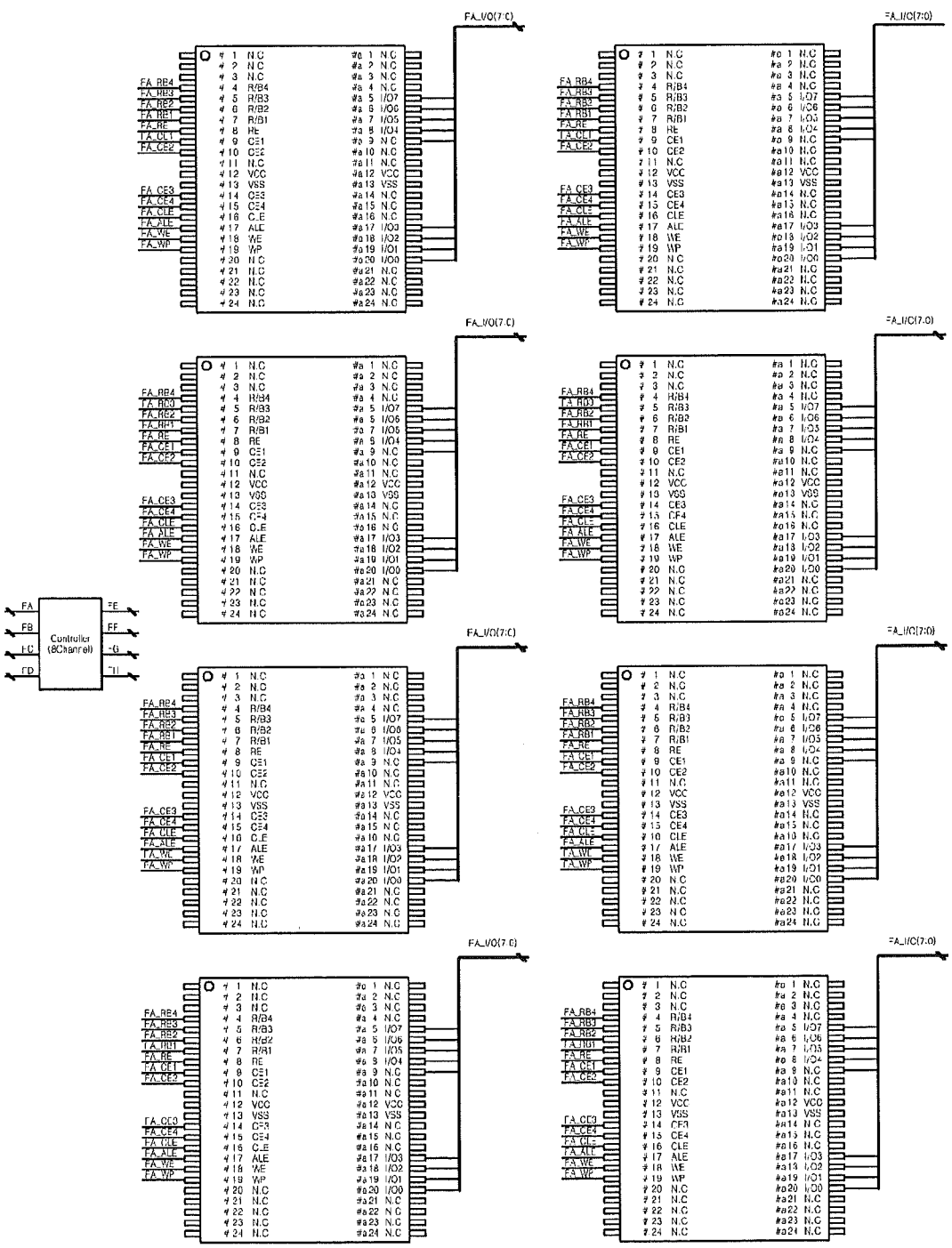
FIG. 23 is a diagram illustrating in detail an example of FIG. 21.

FIG. 21 is a diagram illustrating eight of the semiconductor packages 100, such as shown in FIGS. 1 and 3, which operate with an eight-channel controller 3 when each of the semiconductor packages 100 has only one pin group, according to another example. FIG. 23 is a diagram illustrating in detail an example of FIG. 21.

An exemplary semiconductor package will now be described with reference to FIGS. 1 to 3, 21 and 23. Referring to FIG. 1, the semiconductor package 100 is a thin small outline package (TSOP) that includes multiple semiconductor chips (not shown) enclosed within an encapsulant 1 that protects (e.g. encapsulates) the semiconductor chips, and a plurality of leads 2. At least some of leads 2 are connected to each one of the semiconductor chips and exposed to the outside (e.g. each lead having at least a portion outside the encapsulant 1 to allow subsequent communicative connections with the chips of the package, such as a connection to a printed circuit board). In the particular example as shown in FIG. 1, the semiconductor package (100) includes a total of forty-eight leads 2, which are arranged in the order of N.C, N.C, N.C, R/B4, R/B3, R/B2, R/B1, nRE, nCE1, nCE2, ... , from top to bottom and from left to right, as illustrated in FIG. 1.

In FIG. 1, #1 to #48 denote lead/pin numbers. N.C, N.C, N.C, R/B4, R/B3, R/B2, R/B1, nRE, nCE1, nCE2, ... respectively denote functions of the pins. For example, the pin #44 is an input/output (I/O) 0 pin and is connected to each of the semiconductor chips included in the semiconductor package 100. The I/O0 to I/O7, pins are I/O pins used for data, address and commands. The N.C. leads/pins denote the status of "not connected". The R/B leads/pins are ready/busy output pins. The nRE pins are read enable pins. The nCE leads are chip enable pins. The CLE pins are command latch enable pins. The ALE pins are address latch enable pins. The nWE pins are write enable pins. The nWP pins are write protection pins. The I/O pins are data input/output pins. The VCC pins supply power (e.g, a positive external supply voltages); and Vss pins supply a ground or reference voltage. Some of the pins may have additional functions. For example, the data I/O0 pin may also be used to indicate a program/erase status of NAND flash memory. Unless specified or dictated by context, a generic reference to a pin, lead, terminal, signal line, etc. by a function contemplates both the logic high and logic low versions of that function. For example, reference to "chip enable" or a "CE" (chip enable) pin in this description contemplates both an active logic high CE (e.g., enable chip when logic high) and an active logic low CE (e.g., enable when logic low), but nCE particularly references an active logic low CE; use of both "CE" and "nCE" in this description should not be used to infer that "CE" references only an active logic high CE.

As noted above, the example of FIG. 1 has only one chip group. Thus, each of the chips in package 100, in the same chip group, share at least some of the leads/pins 2. Some of the leads/pins 2 of the chip group may be dedicated to a single chip or a sub-group of chips of the first chip group. For example, to access a single chip of the same chip group, the chip enable (CE) pins may be used. For example, nCE1 pin may be used to access one chip of the chip group and the nCE2 pin may be used to access a different chip of the chip group. When the selection/activation circuitry of the chips are the same (such as when the chips are identical), the nCE1 pin and nCE2 pin are not connected to these chips with this same activation/selection circuitry since activation of one of nCE1 and nCE2 will cause improper signaling to both chips. Rather, in this example, nCE1 will be connected only to one chip, and nCE2 will be connected to the other chip.

Alternatively, the nCE pin may be shared between chips of the chip, groups. For example, an nCE pin may be shared between two chips of an eight-chip chip group. In this instance, the two chips sharing the single nCE pin act like a single chip (e.g., acting like two banks of the same chip, even though they are separated). To distinguish between the two chips sharing the same nCE pin, the two chips may have different selection/activation circuitry. For example, an address decoder of one chip may be operable (or otherwise provide a selecting output) only when an address signal on A0 is low, while the address decoder of the other chip may be operable (or otherwise provide a selecting output) only when the address signal on A0 is high. A selecting output may be an output of the address decoder to activate a word line to allow a read operation or to allow a write operation to a memory, for example. In this latter example, the selection/activation circuitry may be different due to the original manufacture of chips with different circuits (e.g., memory chips may be manufactured with the same circuit and/or layout except variations in the address decoding circuitry), or the selection/activation circuitry may be made different after the original manufacture of the same chips, and later the address decoding circuitry may be altered in one or both of the chips, e.g., through cutting a fuse within a chip by a laser.

Figure 25A:
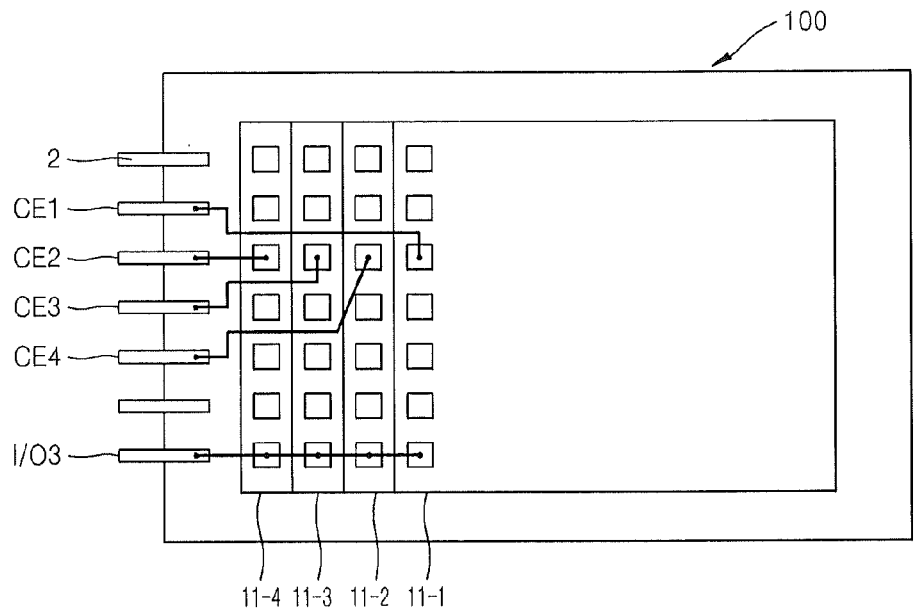
FIGS. 25A, 25B, 25C and 25D illustrate exemplary connections between chip pads and leads within the package of FIG. 1.

FIG. 25A is a diagrammatical top down view of one example of package 100 including four chips, simplified for explanatory purposes. As shown in FIG. 25A, four chips 11-1, 11-2, 11-3 and 11-4 are of the same chip group, sharing connections to pin group 2. Each of the four chips may be substantially identical and have chip pads in the same relative locations having the same functionality, such as the functionality described above with respect to one of the pins 2 in the package 100 (a function associated with pins #1 to #48). Here, only CE and I/O functionality are represented to simplify discussion purposes. In addition to not illustrating all pins and pads of the chips 11, FIG. 25A, like other figures in this application, does not illustrate all connections to all chip pads and leads to help facilitate understanding; it will be understood that such connections may be similar to those described and shown. FIG. 25A represents a common pin connection of all four chips 11-1, 11-2, 11-3 and 11-4 by illustrating a common connection to I/O3 pin, but other pins, such as all I/O pins, may be shared by all the chips of the chip group. Each chip 11-1, 11-2, 11-3 and 11-4 has an individual connection between its chip enable chip pad (here, for each chip, the third pad from the top of the chip as viewed in FIG. 25A) and a corresponding chip enable pin (similarly, third pin from the top of the chip as viewed in FIG. 25A). Here, chip 11-1 chip enable chip pad is connected to CE1, chip 11-2 chip enable chip pad is connected to CE4, chip 11-3 chip enable chip pad is connected to CE3 and chip 11-4 chip enable chip pad is connected to CE4. CE1, CE2, CE3 and CE4 may be enable the chip tow which it is connected with a logic high value or with a logic low value (e.g., correspond to nCE1, nCE2, nCE3 and nCE4 of FIG. 1). Each of the four chips 11-1, 11-2, 11-3 and 11-4 may be enabled through the corresponding CE pin. Because the chips 11-1, 11-2, 11-3 and 11-4 each have an individual CE connection to an individual package pin (the CE connections of each chip are not shared), it is sufficient to activate/select only one CE package pin (one of CE1, CE2, CE3 and CE4) to activate/select only one of the chips 11-1, 11-2, 11-3 and 11-4.

Connections between the pads and the pins may be accomplished in many ways. For example, the CE chip pads may be connected to the corresponding CE pin directly through wire bonding. As noted above, FIG. 25A has been simplified for explanation purposes, and other wire bond connections may be used; e.g., it may be desirable to place the wire bond from chip 11-2 to CE4 other than as represented to prevent interference with other pad connections to the chip. For example, if pads aligned with pin CE3 in FIG. 25A also have wire bonds, it may be desirable to place the wire bond from chip 11-2 to CE4 above these pads (to the top of FIG. 25A).

Figure 25B:
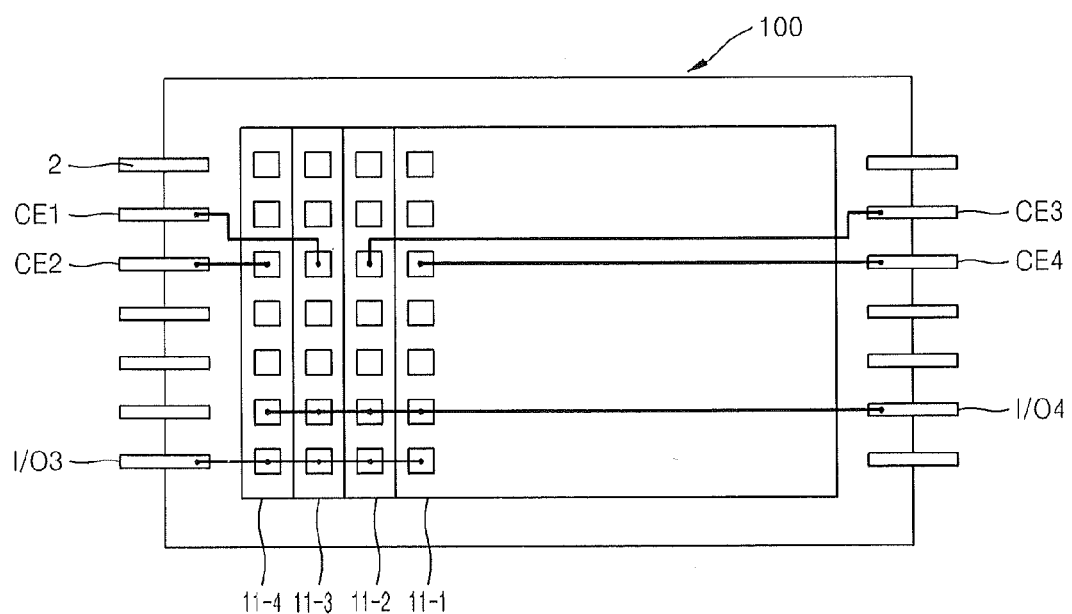

FIG. 25B illustrates an alternative arrangement, where connections to the chip enable pads of chips 11-1 and 11-2 are made to chip enable pins CE3 and CE4 on the opposite side of the package from the location of chip enable pins CE1 and CE2. Such connections may be assisted by lead routing across the top of chip 11-1 by means of a redistribution layer (not shown). The redistribution layer may be formed by a deposition process on a wafer containing chip 11-1 prior to its singulation (e.g., sawing) from the wafer, or may be made on a separate interposer layer, later attached to the top surface of chip 11-1, before or after singulation of chip 11-1 from its wafer.

Figure 25C:
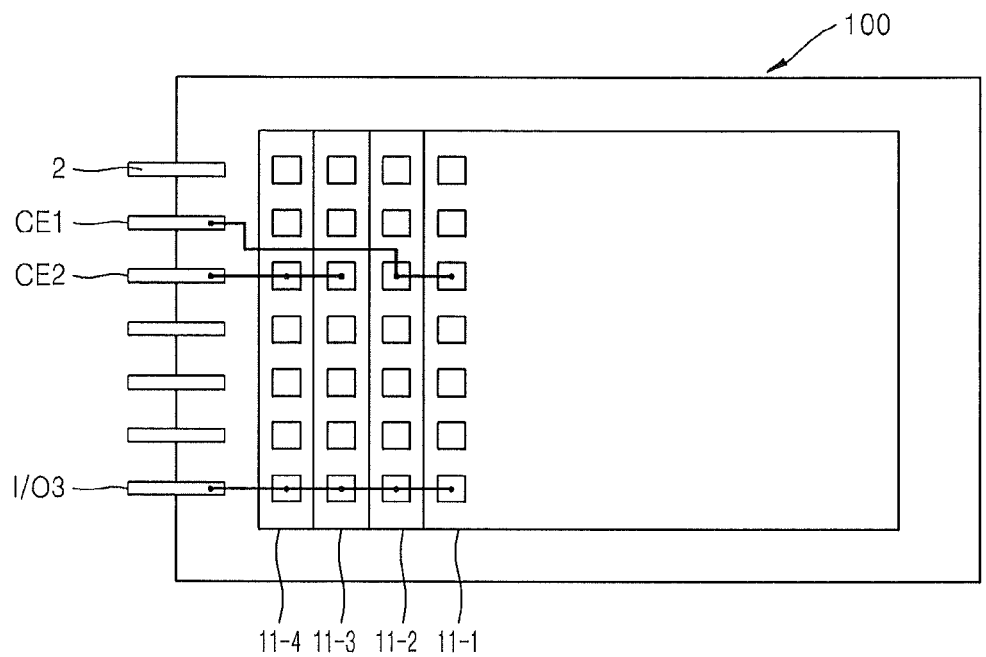

FIG. 25C illustrates an example of a chip group of four chips in package 100 of FIG. 1, where plural chips share the same chip enable (CE) pin. In the example of FIG. 25C, chips 11-1 and 11-2 are both connected to CE1 pin of leads 2 and chips 11-3 and 11-4 are both connected to CE2 pin of leads 2. Activation of a chip enable signal on CE1 (e.g., a high signal or a low signal) will be transmitted to both chips 11-1 and 11-2, activating or enabling both chips. To distinguish which of chip 11-1 and 11-2 should respond in full to the activation, further circuitry within chips 11-1 and 11-2 is used. For example, the address A0 received on a separate pin by both chips (not shown) may be input and processed by the address decoders of chips 11-1 and 11-2. When both chips 11-1 and 11-2 are enabled by a chip enable signal on CE1, a logic high signal on A0 may result in chip 11-1 activating some internal circuitry and preventing activation of the same or similar internal circling in chip 11-2. When both chips 11-1 and 11-2 are enabled by a chip enable signal on CE1, a logic low signal on A0 may result in chip 11-2 activating some internal circuitry and preventing activation of the same or similar internal circuitry in chip 11-1. This may be accomplished by including different address decoders in chips 11-1 and 11-2, which may be a result of using different chip designs or modification of one or both of the chips (with the same chip design) after manufacture (such as by cutting a fuse with a laser).

Figure 25D:
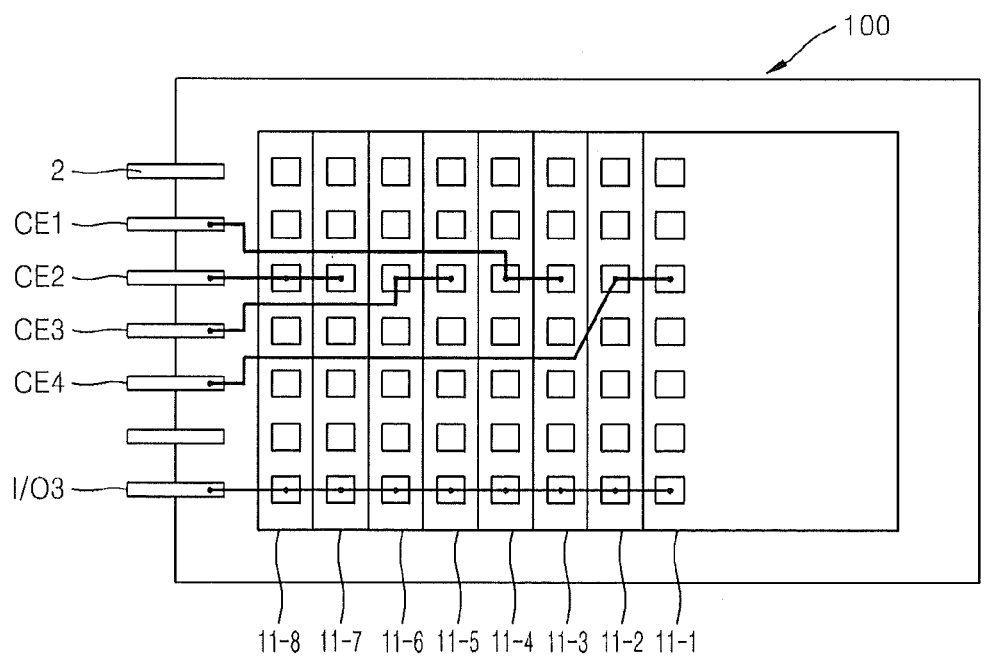

FIG. 25D illustrates an example of a chip group of eight chips in package 100 of FIG. 1, where plural chips share the same chip enable (CE) pin. FIG. 25D varies from the above description in connection with FIG. 25C in that the package includes four chip enable inputs on four package pins (CE1, CE2, CE3 and CE4) rather than the two (CE1 and CE2) illustrated in FIG. 25C.

For all of the packages of FIGS. 25A, 25B, 25C and 25D, there are various ways to implement the diagrammatically illustrated connections between the chip pads and the package pins. The examples of FIGS. 25C and 25D may also include connections of chip pads to pins on opposite sides of the package, such as shown in FIG. 25B. In addition, all of FIGS. 25A to 25D illustrate use of pins to provide signal and other electrical connections (e.g., power and ground) to the package 100. However, the invention is not limited to pin type connections. For example, solder balls connected to a bottom surface of a package substrate (e.g., a package type PCB substrate, such as that formed from FR4 material) may be used. It may also be beneficial to provide a redistribution layer on or as part of the package substrate rather than the direct wire bond connections to the package terminals (here pins 2) as represented in FIGS. 25A to 25D. Thus any of the connections shown in FIGS. 25A to 25D from pads to package terminals may be made above or below the chips within the package 100.

Even if only one of the semiconductor chips included in the semiconductor package 100 is defective, the semiconductor package 100 as a whole may malfunction since the pins are shared between all the semiconductor chips.

In the example as illustrated in FIG. 2, when the 4-four channel controller 3 is connected to the semiconductor packages 100 shown in FIG. 1, first channel lines 3a, second channel lines 3b, third channel lines 3c, and fourth channel lines 3d are respectively connected to corresponding one of the four semiconductor packages 100. When the eight-channel controller 3 is connected to the semiconductor packages 100, such as shown in FIG. 1, as illustrated in FIGS. 3, 21, and 23, first channel lines 3a, second channel lines 3b, third channel lines 3c, fourth channel lines 3d, fifth channel lines 3e, sixth channel lines 3f, seventh channel lines 3g, and eighth channel lines 3h are respectively connected corresponding ones of the eight semiconductor packages 100. In the examples of FIGS. 2 and 3, each of the channels includes two or more sub-channels. Each sub-channel may be identified by an individual CE (including an nCE) connection, thus each channel in FIGS. 2 and 3 includes a first sub-channel, identified by a CE1 connection (or signal line) and a second sub-channel identified by a CE2 connection (or signal line). The signal lines of the sub-channels are separate and not shared between any other sub-channels. However, other channel lines of the sub-channels may be shared, by sub-channels of the same channel, and/or by sub-channels of other channels. In FIGS. 2 and 3, the shared connections are represented by the I/O lines branching off of the channel lines. These I/O lines may include the I/O lines I/O0 through I/O7 as well as other shared lines (e.g., see discussion above in connection with shared pins of a chip group).

Thus, in the examples of FIGS. 2 and 3, a set of shared lines, such as I/O lines, are connected to all the chips of the single chip group within package 100, while other lines are connected to a single chip (or plural chips, such as two chips acting as a single chip). Dedicated lines that may be connected only to a single chip (or plural chips in a package 100 which are only part of the single chip group) include lines for chip enable (CE including nCE), RE (reset), CLE (clock enable), power (Vcc) and/or ground power (Vss). These dedicated lines will have a dedicated connection between the package 100 and controller 3, while shared lines, such as I/O lines, may connect to a common shared bus, such as a common I/O bus, connected between controller 3 and the plural packages 100.

For simplicity, the connection of the I/O lines of the channel to the package pins are not shown in FIGS. 2 and 3. It should also be noted that the channel lines may be connected to pins on both sides of a package 100, even when the channel lines approach the package from only one side. For example, the channel lines 3a in FIG. 2 may run underneath package 100 along a printed circuit board (PCB) on which the package 100 is mounted to connect to the pins on the right side of package 100 (as viewed in FIG. 2). For example, the channel lines 3a through 3h may be interposed between the printed circuit board (PCB) and the respective package 100 to which whey connect, or may run on a surface of the PCB opposite to the surface of the PCB on which the respective package is mounted to which they connect (and conductive through holes in the PCB may provide appropriate connections between the PCB and package pins). The channel lines may be formed by patterning a metal deposited on the PCB substrate.

In further examples, the semiconductor chips in a semiconductor package are divided into multiple chip groups; and each chip group has plural semiconductor chips. The semiconductor chips in the same chip group are disposed in a stepwise fashion along one spatial direction; and semiconductor chips in different chip groups are disposed in stepwise fashion along different spatial directions. Different chip groups can be placed at the same or opposite major surfaces of a package substrate, such as a die paddle (e.g., a major supporting surface of a lead frame).

In accordance with the chip groups, multiple lead groups are provided to the semiconductor package. At least some of the leads of a lead group are connected to all of the semiconductor chips of a corresponding chip group; and different lead groups are connected to semiconductor chips of different chip groups. As a consequence, the same functional I/Os of the semiconductor chips in the same chip group share the same leads; and the semiconductor chips in different chip groups are connected to different leads.

Figure 4:
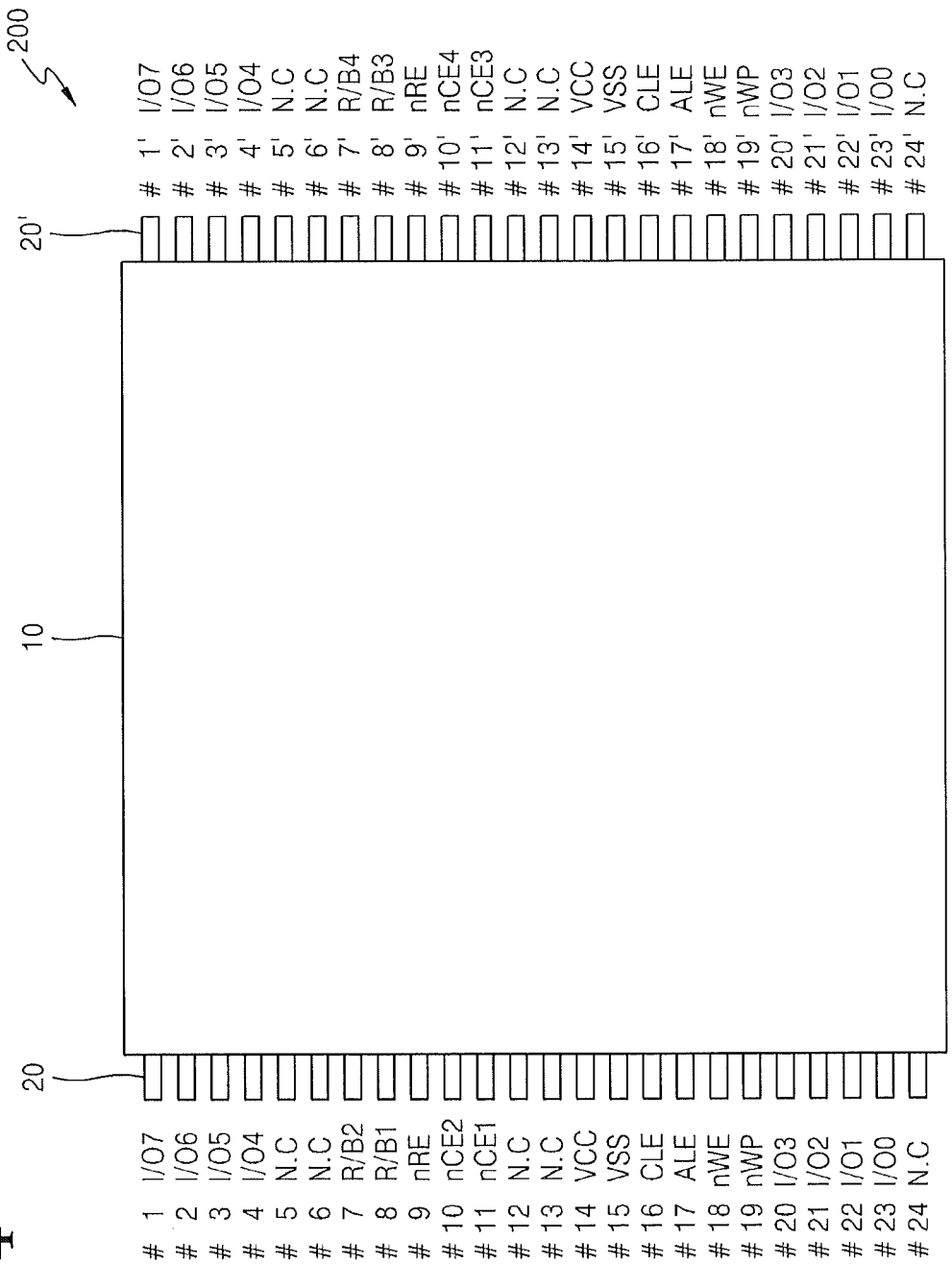
FIG. 4 is a plane view of the lead arrangement of a semiconductor package according to another example of the disclosure.
Figure 8:
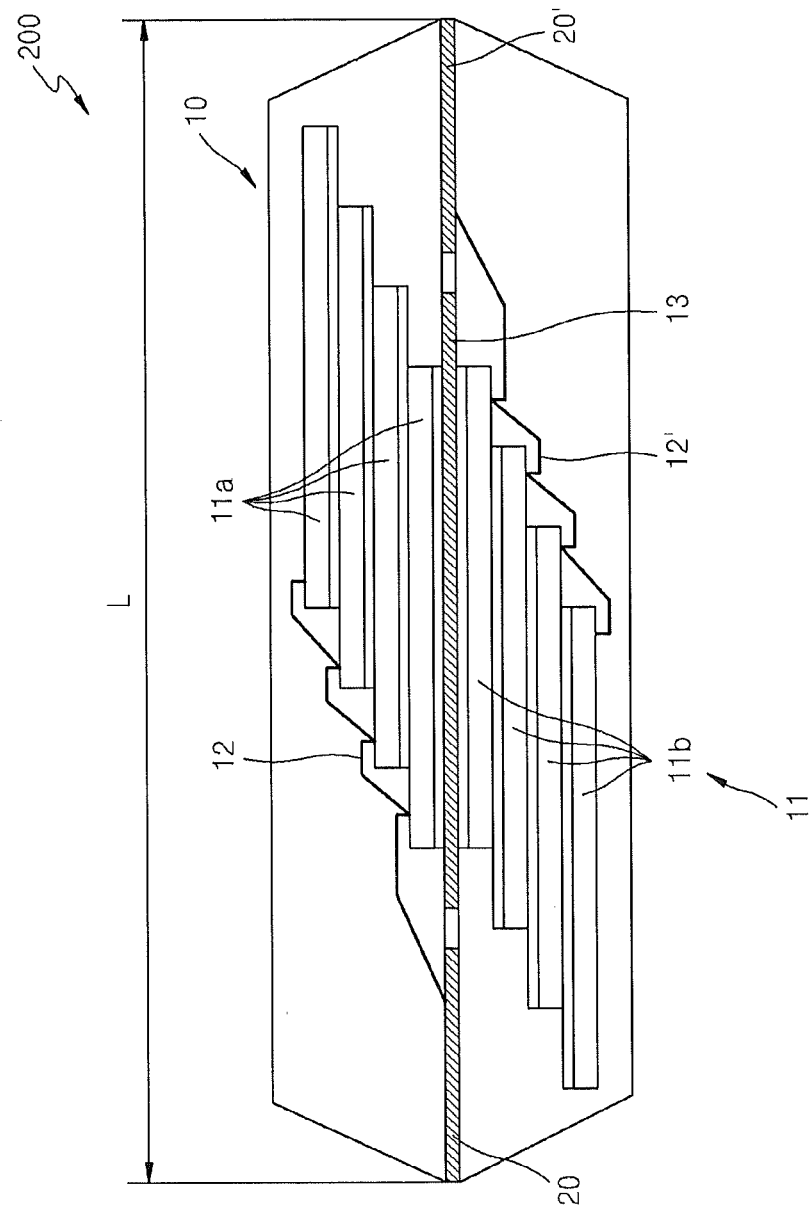
FIG. 8 is a side cross-sectional view of the semiconductor package of FIG. 4.

FIG. 4 and FIG. 8 illustrate an exemplary semiconductor package having multiple semiconductor chip groups. All signal connections to one chip group within a package are separate from signal connections to another chip group within a package. That is, as discussed below, while signal connections may be shared between chip groups by virtue of a connection outside the package 200 (such as a connection to a common I/O bus), within the package 200, the signal connections to one chip group are isolated (e.g., not shared) from the signal connections to another chip group. To facilitate ease of communication, the following discussion may reference concepts of pins, leads, connections of a package, etc., as being dedicated to one chip group and/or not shared with another chip group, such discussion references only those elements which are part of the package; further external connections to the chip groups (of one package and/or of other packages) are contemplated which may connect such otherwise isolated pins, leads, connections of multiple chip groups in, common. Further, each of the chip groups may have signal connections similar to those of the single chip group described above with respect to FIG. 1; that is, each chip group includes shared connections between the plurality of chips of the chip group (such as the I/O lines) and includes connections dedicated to a chip or a portion of the chips of the chip group (e.g., a CE connection to a package pin unique to each chip of the chip group, or unique to plural chips acting as a single chip).

Figure 5:
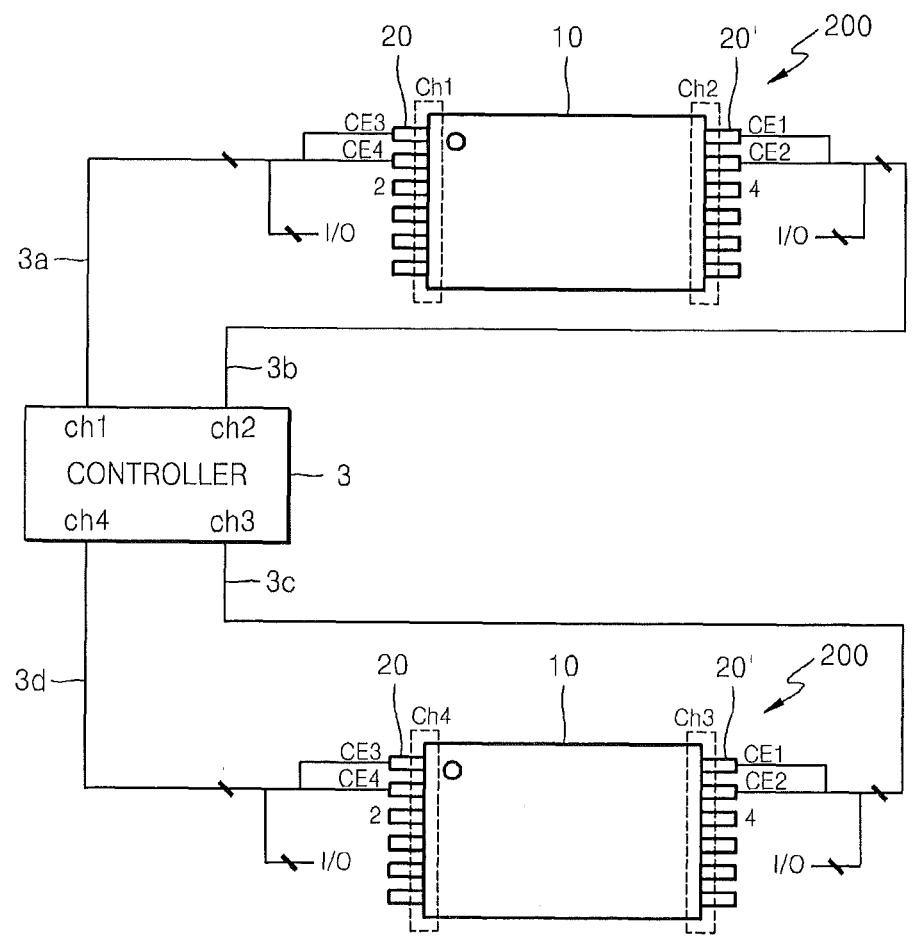
FIG. 5 is a diagram illustrating a case where semiconductor packages such as shown in FIG. 4 are connected to a four-channel controller.
Figure 6:
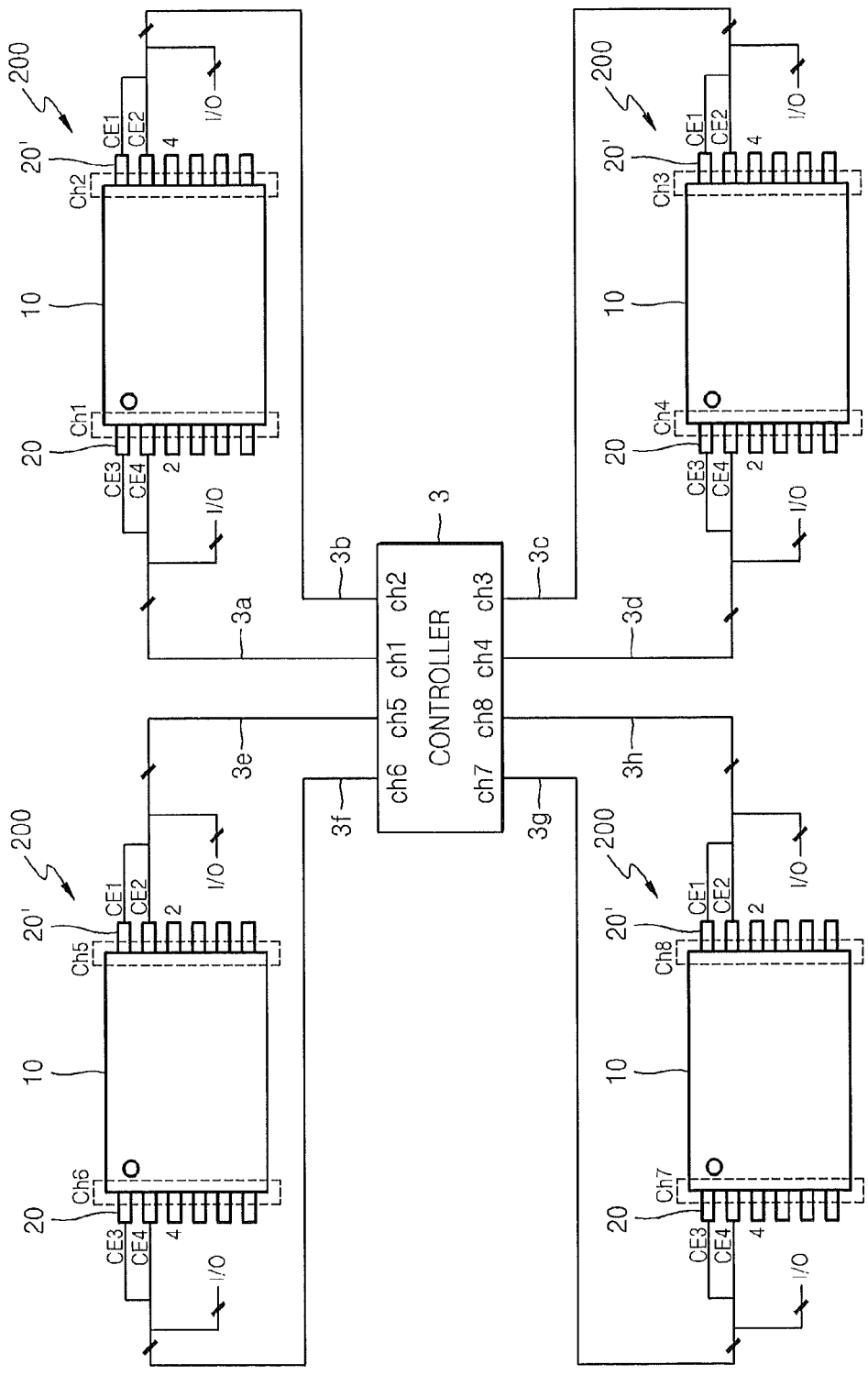
FIG. 6 is a diagram illustrating a case where semiconductor packages such as shown in FIG. 4 are connected to an eight-channel controller.
Figure 7:
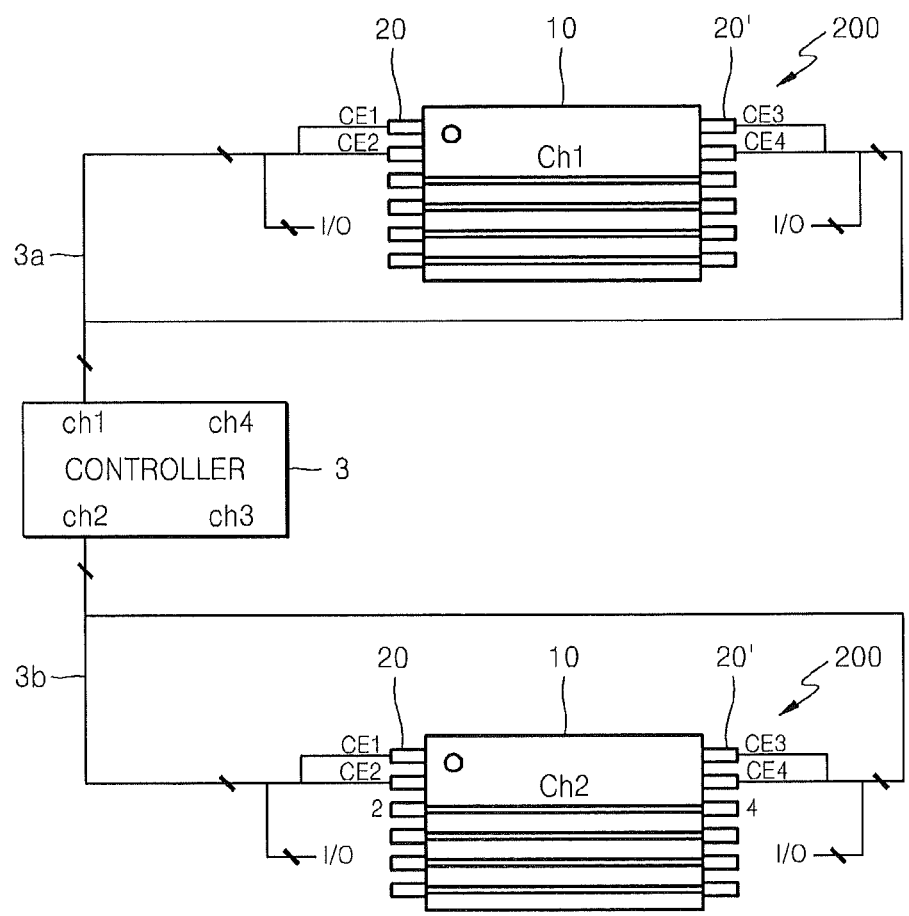
FIG. 7 is a diagram illustrating a case where semiconductor packages such as shown in FIG. 4 are respectively connected in parallel to two channels of a four-channel controller.
Figure 9:
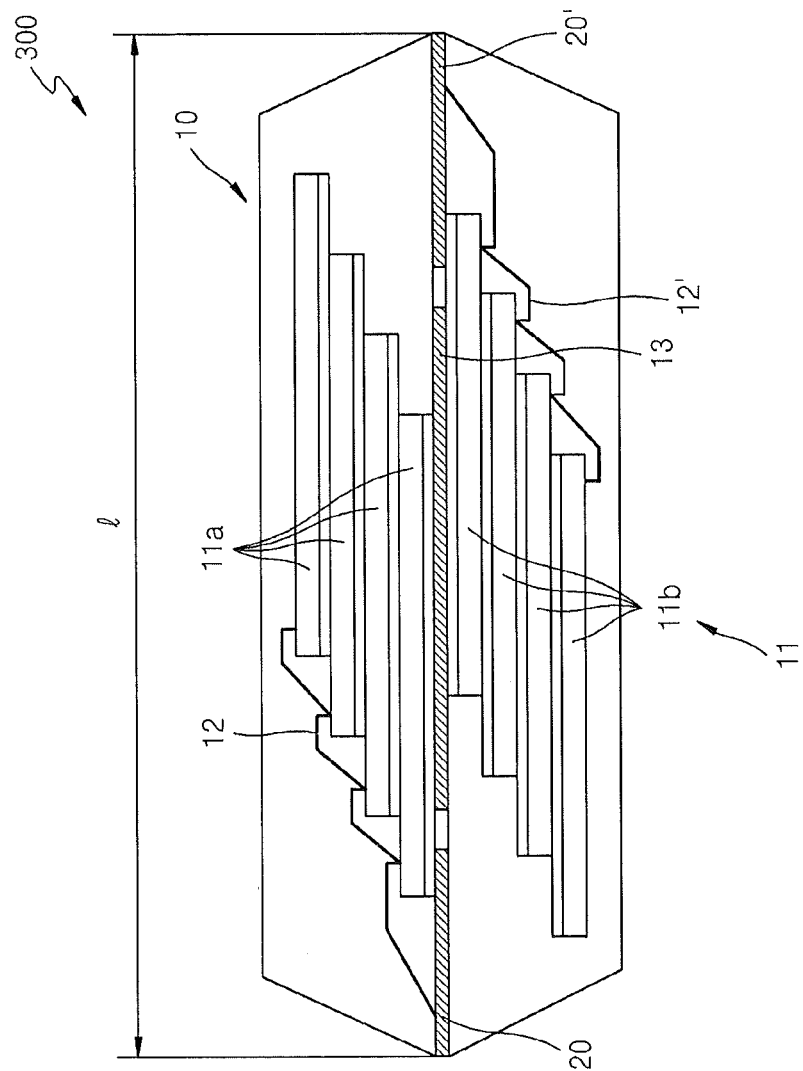
FIG. 9 is a side cross-sectional view of a semiconductor package according to another example of the disclosure.
Figure 10:
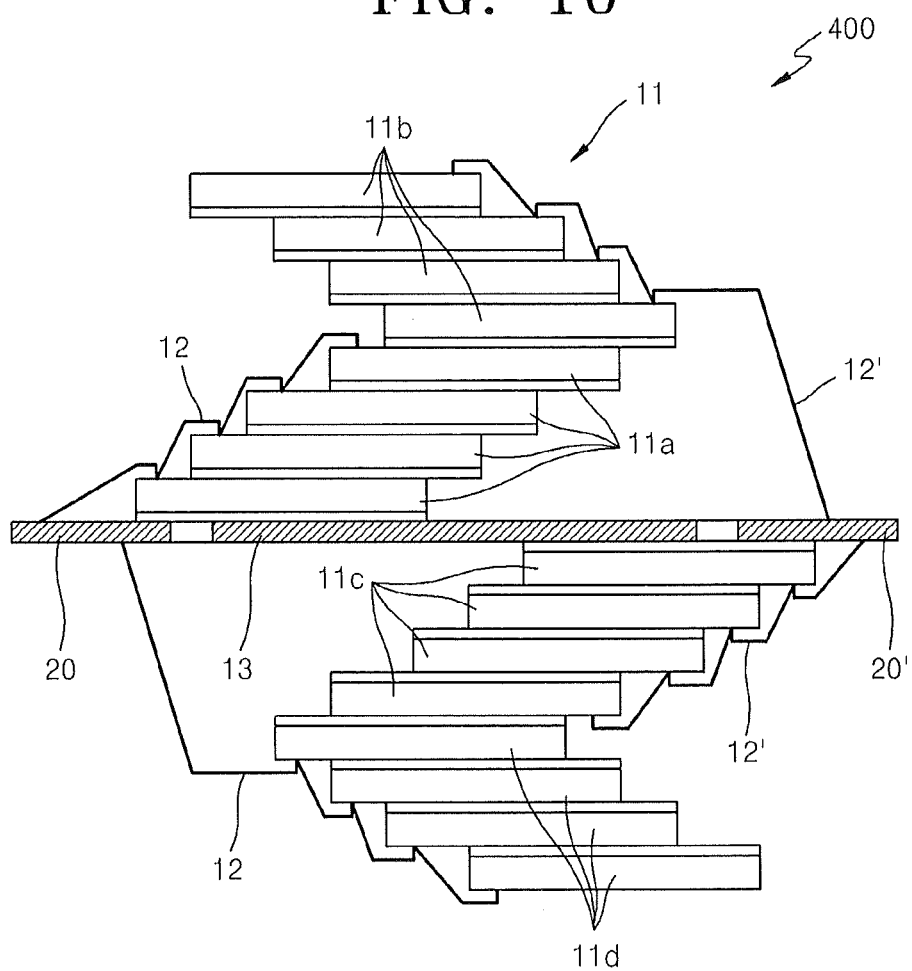
FIG. 10 is a side cross-sectional view illustrating a stacked structure of semiconductor chips, according to yet another example of the semiconductor package of FIG. 9.

FIG. 4 is a plane view of the pin arrangement of an example semiconductor package 200. FIG. 5 is a conceptual diagram illustrating a case where the semiconductor packages 200, such as shown in FIG. 4, are connected to a four-channel controller. FIG. 6 is a conceptual diagram illustrating a case where the semiconductor packages 200, such as shown in FIG. 4, are connected to an eight-channel controller. FIG. 7 is a conceptual diagram illustrating a case where the semiconductor packages 200, such as shown in FIG. 4, are respectively connected in parallel to two channels of a four-channel controller. FIG. 8 is a side cross-sectional view of the semiconductor package 200 of FIG. 4. FIG. 9 is a side cross-sectional view of a semiconductor package 300 according to another embodiment of the inventive concept. FIG. 10 is a side cross-sectional view illustrating a stacked structure of semiconductor chips in a semiconductor package 400 according to another example of the semiconductor package 300 of FIG. 9.

Referring to FIGS. 4 and 8, the semiconductor package 200 in this example comprises multiple semiconductor chips 11 (not shown in FIG. 4) protected via an encapsulant 10, and a plurality of leads (20 and 20') that are connected to the semiconductor chips 11 and are exposed to the outside (e.g. extend outside of the encapsulant) terminating in the pin portion of the lead.

The plurality of leads is divided into multiple pin groups, such as first pin group 20 and second pin group 20'. In this example, pins of the same pin group are located at one side of the semiconductor package; whereas the pins of different pin groups are located at a different side of the semiconductor package in the top view as illustrated in FIG. 4. For example, pins of pin group 20 are located at the left major, side of the semiconductor package 200; and pins of pin group 20' are located at the right side of the semiconductor package 200 in the top view of the semiconductor package. The leads of the first lead group 20 are exposed on the left side of the encapsulant 10 in the top view and are given numbers #1 to #24. The leads of the second lead group 20' are exposed on the right side of the encapsulant 10 in the top view and are given numbers #1' to #24'.

In this example, all pins of the same pin group are connected only to one or more semiconductor chips of the same chip group in the semiconductor package 200; and all pins of a different pin groups are connected only to one or more semiconductor chips of that different chip group in the same semiconductor package 200. The pins of a pin group shared by all chips of the chip group may be all, substantially all, a majority or only some of the pins. For example, all the pins but chip enable (CE) pins may be connected in common fashion to the corresponding chips of the same chip group (e.g., connected to a corresponding same functional chip pad of each chip of the chip group). Each pin which is connected to multiple chips of a chip group generally may be connected to the same functional pad of each chip of the chip group. For example, I/O 7 may be connected to a pad corresponding to I/O 7 of each chip of the chip group.

Referring to FIG. 8, the semiconductor package 200 in this example comprises two chip groups 11a and 11b. Each chip group comprises multiple semiconductor chips. Here, each chip group comprise four semiconductor chips. It is noted that each chip group may comprise any desired number of semiconductor chips. The two chip groups 11a and 11b are attached to a lead frame substrate, exemplified here by die paddle 13, at the opposite major surfaces of the die paddle 13. For example, the chip group 11a is disposed at the major top surface of die paddle 13; and the chip group 11b is disposed at the major bottom surface of die paddle 13.

The semiconductor chips in each chip group are stacked vertically in a stepwise fashion and along different spatial directions. As diagrammatically illustrated in FIG. 8, the semiconductor chips of chip group 11a are stacked vertically, on and attached to the die paddle 13. Each upper semiconductor chip is shifted a distance (e.g. a distance such that the connection pads of the lower semiconductor chip are exposed) relative to the immediate lower semiconductor chip. A similar stacking is made with respect to chip group 11b on the lower surface of die paddle 13.

The pins of first lead group 20 are exposed from the encapsulation at one side of the package and semiconductor chip group 11a (left side in FIG. 8). The pins of second lead group 20' are exposed at the opposite side of the package. The chip pads of the semiconductor chips are connected to the leads of lead groups 20 and 20'. Specifically, the chips pads of semiconductor chips in chip group 11a are connected to leads of lead group 20; and the chips pads of semiconductor chips in chip group 11b are connected to leads of lead group 20'. In the specific example as illustrated in FIG. 8, in chip group 11a, the chip pads of each upper semiconductor chip are connected to the corresponding chip pads (e.g. of the same function) of the immediate lower semiconductor chip. The chip pads of the bottom most of semiconductor chip of chip group 11a are connected to the leads of lead group 20. In chip group 11b, the chip pads of each lower semiconductor chip are connected to the corresponding chip pads (e.g. of the same function) of the immediate upper semiconductor chip. The chip pads of the top most of semiconductor chip of chip group 11a are connected to the leads of lead group 20. The above connections of from chip pads to chip pads and from chip pads to leads in each chip groups are accomplished through wire bonding.

It is noted that above electrical connection scheme is only one of possible ways to electrically connect chips to the leads. Other variations are also applicable. For example, the chip pads of each semiconductor chips in the package can be directly connected to the corresponding leads through wire bonding. Specifically, the chip pads of each one of the chips in chip group 11a can be directly connected to the leads of lead group 20. The chip pads of each one of the chips in chip group 11b can be directly connected to the leads of lead group 20'.

The leads of lead groups 20 and 20' can be electrically connected to a controller in many ways, one of which is diagrammatically illustrated in FIG. 5. Referring to FIG. 5, the leads of lead group 20 are electrically connected to channel line 3a of controller 3. The channel line 3 is capable of delivering signals, such as control signals, to the corresponding leads of the semiconductor chips in chip group 11a (as discussed above with reference to FIG. 8), such as CE (chip enable) and I/O leads of lead group 20. The leads of lead group 20' are electrically connected to channel line 3b of controller 3, wherein channel 3a and 3b are separate channels (e.g. in parallel). The channel line 3b is capable of delivering signals, such as control signals and data signals, to the corresponding leads of the semiconductor chips in chip group 11b (as discussed above with reference to FIG. 8), such as CE (chip enable) and I/O leads of lead group 20.

All the semiconductor chips (e.g. semiconductor chips of chip groups 11a and 11b) may be mounted only on the die paddle 13 as illustrated in FIG. 8, alternatively some of the semiconductor chips may be mounted on the die paddle 13 and the first and/or the second lead groups 20 and 20', and example of which is diagrammatically illustrated in FIG. 9.

Referring to FIG. 9, the size l of the semiconductor package 300, in which the semiconductor chips 11 are mounted to cover all the die paddle 13 and the first and second pin groups 20 and 20', is less than the size L of the semiconductor package 200 of FIG. 8, in which the semiconductor chips 11 are mounted only on the die paddle 13, thereby improving the integration degree of the semiconductor package 300. In the example of FIG. 9, the bottom semiconductor chip of chip group 11a is mounted on the die paddle 13 and extends over lead group 20 and a similar arrangement is given with respect to chip group 11b, lead group 20' and the bottom surface of the die paddle 13. However, it may be preferable to The semiconductor chips of a chip group can be stacked and shifted in multiple directions, an example of which is illustrated in FIG. 10. Referring to FIG. 10, multiple chip groups are placed on each side of die paddle 13. Specifically, chip groups 11a and 11b are placed on one side (e.g. the top major surface) of die paddle 13 and have die pad connections to pin group 20. Chip groups 11c and 11d are placed on the other side (e.g. the bottom major surface) of die paddle 13 and have die pad connections to pin group 20'.

The semiconductor chips on the same side of the die paddle 13 are stacked and shifted in multiple directions. Specifically, the semiconductor chips of chip group 11a are stacked in a forward (e.g. forward along the upper-right direction) stepwise fashion; while the semiconductor chips of chip group 11b are stacked on the chip group 11a and in a backward (e.g. backward along the upper-left direction) stepwise fashion. As such, the trajectory of the centers (or any equivalent points, such as the top-left corners) of the semiconductor chips of chip groups 11a and 11b is bent. Similarly, the semiconductor chips of chip group 11e are stacked in a backward (e.g. backward along the left-downward direction) stepwise fashion; while the semiconductor chips of chip group 11d are attached to the chip group 11c and in a forward (e.g. forward along the right-downward direction) stepwise fashion. As such, the trajectory of the centers (or any equivalent points, such as the top-left corners) of the semiconductor chips of chip groups 11c and 11d is bent. Rather than the bent trajectories discussed above, other non-linear trajectories may be used such as a zig-zag trajectory or a spiraling trajectory.

Because it is more efficient to fabricate the semiconductor chips of a semiconductor package to have substantially the same structure, physical shape, and/or function especially in mass production, the semiconductor chip groups 11a and 11b may have the same or substantially the same pad arrangement. Similarly, the lead groups 20 and 20' may have the same pin arrangement.

It will be appreciated by those skilled in the art that the above description is for demonstration purpose; and the examples discussed above are some of many possible examples. Other variations are also applicable. For example, the lead groups may have different pin arrangements; and the chip groups may have different pad arrangements, especially when some of the semiconductor chips (e.g. semiconductor chips of chip groups 11a, 11b, 11c, and 11d) are connected to an I/O 0 lead of the lead group 20 and the other semiconductor chips are connected to an I/O 0 lead of the lead group 20'.

For another example, each one of the lead groups 20 and 20' may have at least one of the group comprised of an I/O lead, an NC pin, an R/B pin, a CE pin, a Vcc pin, a Vss pin, and a Wp pin. An I/O0 lead indicates a program/erase status. In the case of NAND flash memory, I/O 0 to 7 pins may be arranged. For example, the values "0" and "1" of the I/O0 pin may, respectively, define a normal program/erase (pass) status and an error-in-program/erase (fail) status. The I/O 1 to 5 pins are reserved for future use. The I/O6 pin indicates a device operation status. For example, the values "0" and "1" of the I/O6 pin may, respectively, define a busy status and a ready status. The I/O7 pin indicates a write protect status. For example, the values "0" and "1" of the I/O7 pin may, respectively, define a protected status and a not-protected status.

A ready/busy signal is delivered via the RIB pin. For example, if the value of the R/B pin defines 'ready', data may be input to or output from a semiconductor chip, and if the value of R/B pin defines 'busy', data is prevented from being input to or being output from a semiconductor chip.

The CE pin is a chip selection pin. For example, when two semiconductor chips are connected to one pin group, one of the semiconductor chips may be selected via a CE1 pin and the other semiconductor chip may be selected via a CE2 pin, thereby accessing these semiconductor chips.

The Vcc pin is a pin to which 3.3 V or 5.0 V, for example, is applied as power for driving a NAND flash. The Vss pin is a ground pin. The Wp pin is a pin for forced resetting.

The NC pin is a no-selection pin and is a surplus pin that is not electrically connected to a semiconductor chip, or it may be a pin that is used for testing purposes only; NC pins may or may not be considered part of a lead group according to this disclosure. Other pins and pin arrangements may be used as exemplified and, explained by data sheets of various semiconductor packages.

Referring again to FIG. 5, a multiple channel controller, such as controller 3 having four channels 3a, 3b, 3c, and 3d, can be used to concurrently (or in parallel) to control semiconductor chips of multiple chip groups (four in this example). Specifically, two semiconductor packages 200 each having two chip groups as discussed above with reference to FIG. 4 and FIG. 8 are electrically connected to controller 3. The semiconductor chips of chip group 11a and 11b of one of the semiconductor packages 200 are connected to channels 3a and 3b as discussed above; and the semiconductor chips of chip group 11a and 11b of the other one of the semiconductor packages 200 are connected to channels 3c and 3d. That is, the four-channel controller 3 is connected to two of the semiconductor packages 200.

Referring to FIG. 6, an eight-channel controller 3 is connected to a plurality of the semiconductor packages 200; a first package 200 is connected to the controller 3 via first channel lines 3a and second channel lines 3b, a second package 200 is connected via third channel lines 3c and fourth channel lines 3d, a third package 200 is connected via fifth channel lines 3e and sixth channel lines 3f, and a fourth package 200 is connected via seventh channel lines 3g and eighth channel lines 3h. Because each one of the semiconductor packages 200 may be connected to two or more channels, it is possible to reduce the total number of the semiconductor packages 200 to be mounted to a printed circuit board or other system connection to a number less than the number of channels used by the controller (or to a number less than the total number of channels of the controller).

Referring to FIG. 7, a plurality of the semiconductor packages 200 may be connected in parallel to each channel (of the four-channel controller 3). A plurality of leads may be divided into a first pin group 20 that is exposed in a direction corresponding to one side of the semiconductor chip group 11a and is connected to the first pin group 20 of the first channel line 3a, and a second pin group 20' that is exposed in a direction corresponding to one side of the semiconductor chip group 11b (that is opposite to the direction corresponding to the one side of the semiconductor chip group 11a) and is connected in parallel to the first channel line 3a of the controller 3.

Thus, if leads of the semiconductor package 200 are divided into a single pin group, one of the leads corresponds to one of the I/O0 to I/O7 pins. However, if leads of the semiconductor package 200 are divided into two pin groups 20 and 20', two of the leads correspond to one of the I/O0 to I/O7 pins. In this case, a plurality of pieces of data may be simultaneously input or output in parallel, thereby improving the speed of inputting/outputting data.

Figure 11:
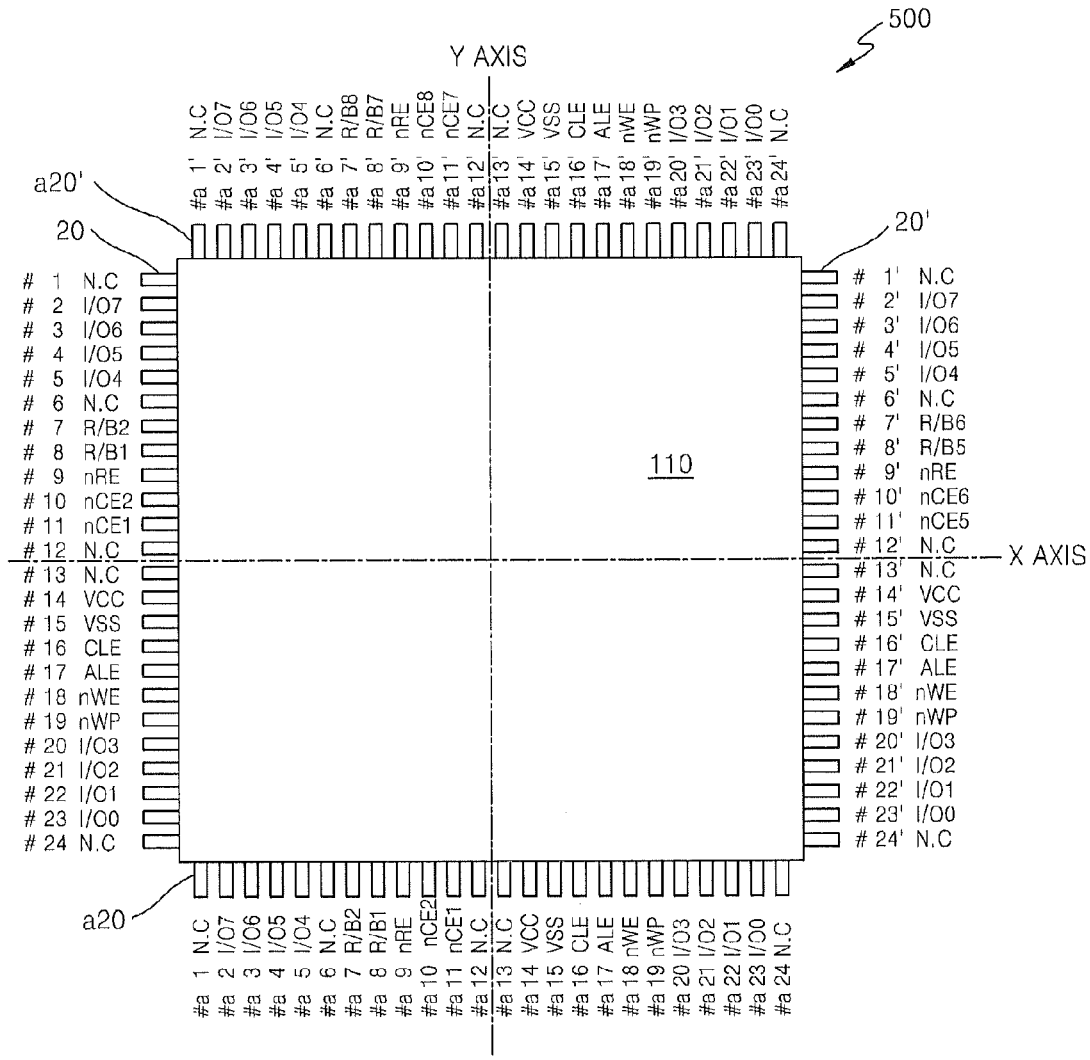
FIG. 11 is a plane view illustrating the lead arrangement of a semiconductor package according to yet another example of the disclosure.
Figure 12:
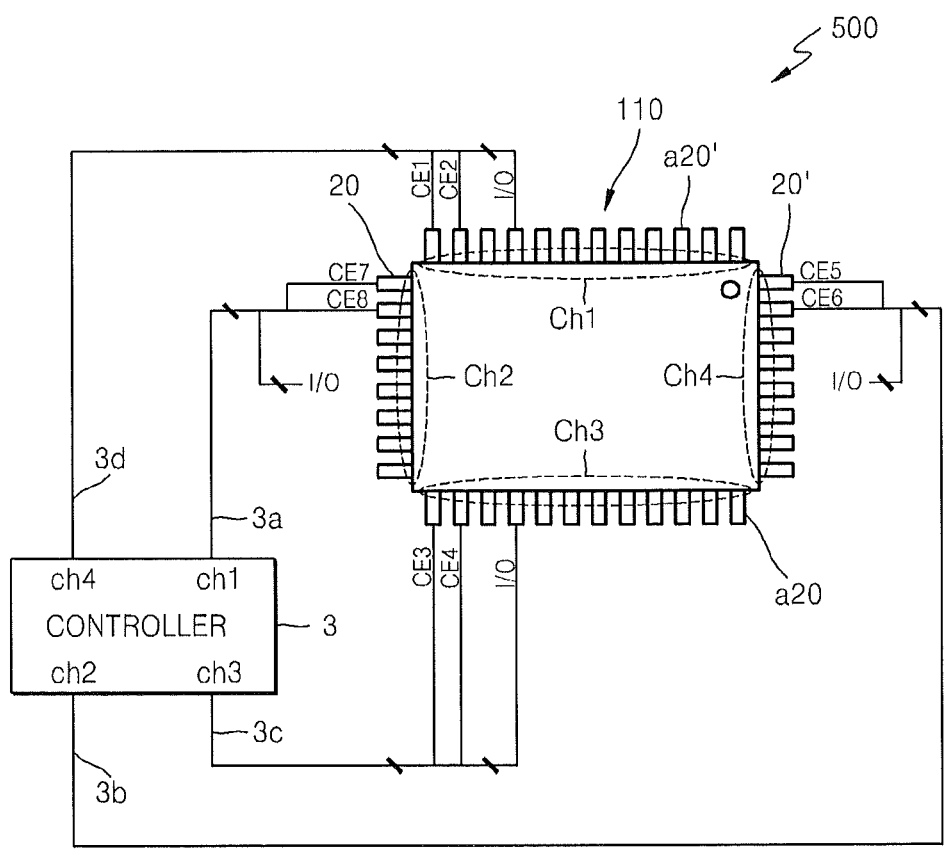
FIG. 12 is a conceptual diagram illustrating a case where the semiconductor package of FIG. 11 is connected to a four-channel controller.
Figure 13:
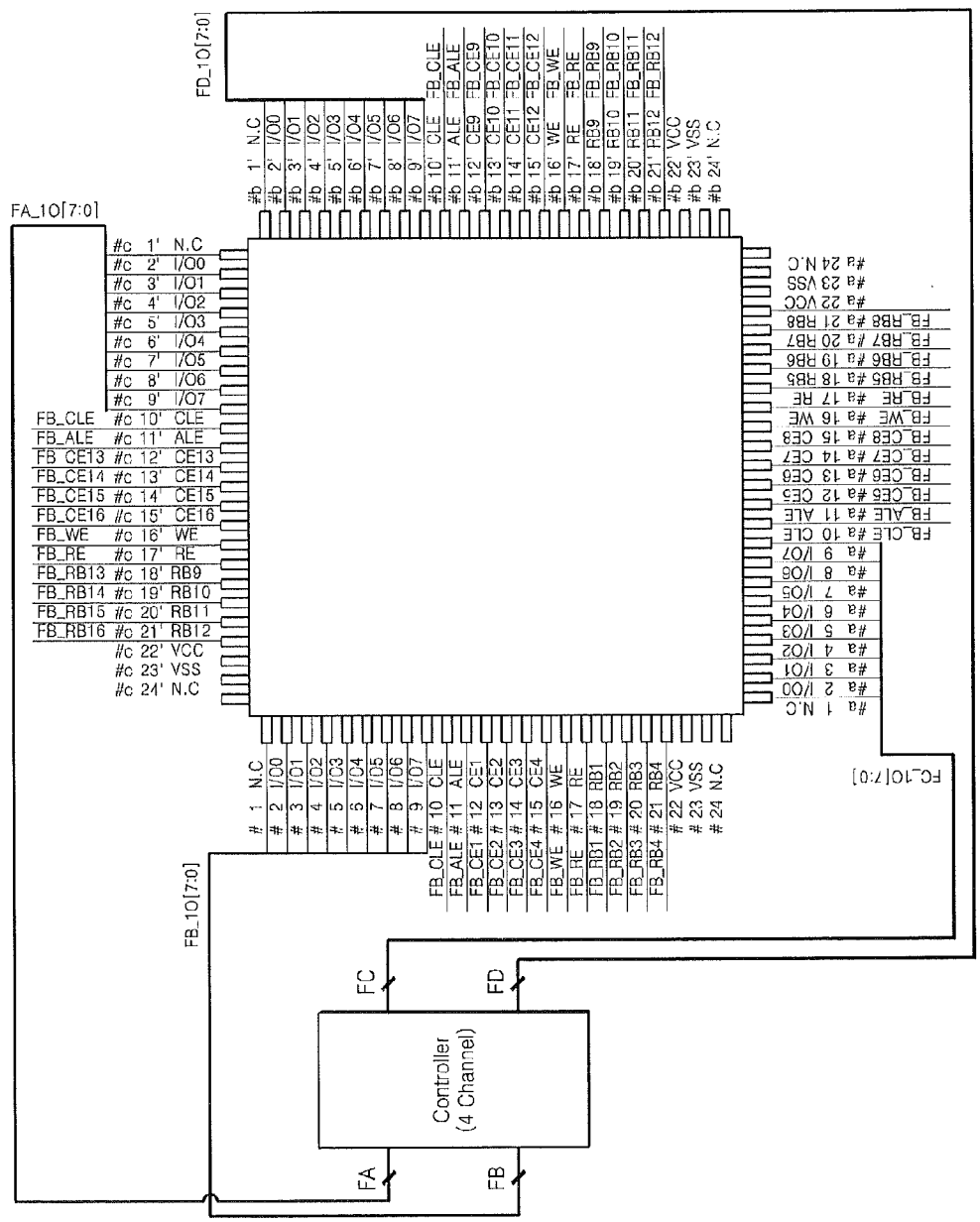
FIG. 13 is a diagram illustrating in detail an example of the diagram of FIG. 12.
Figure 14:
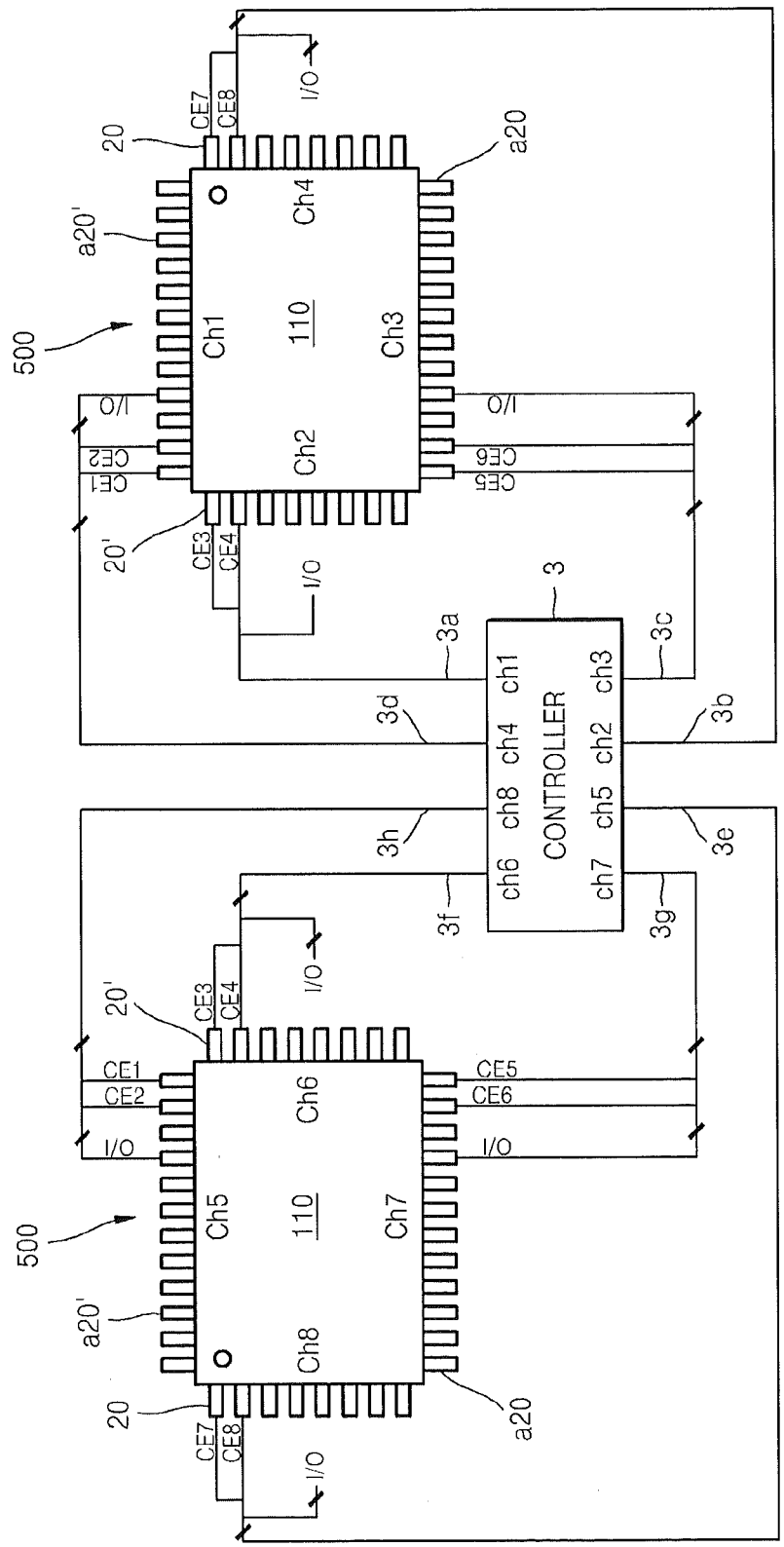
FIG. 14 is a diagram illustrating a case where the semiconductor package of FIG. 11 is connected to an eight-channel controller.
Figure 15:
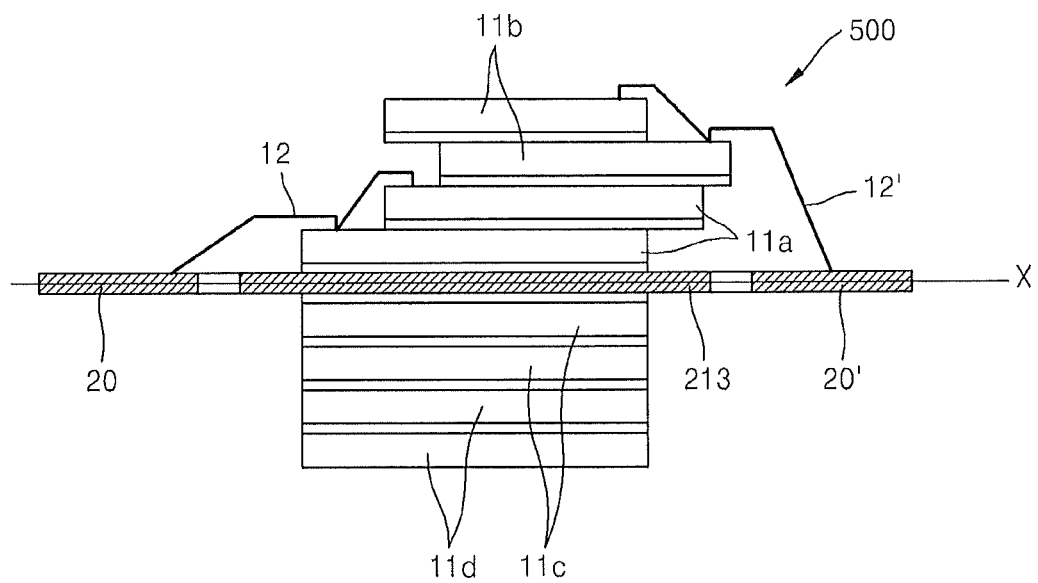
FIG. 15 is a side cross-sectional view illustrating a stacked structure of semiconductor chips in the semiconductor package of FIG. 11.
Figure 16:
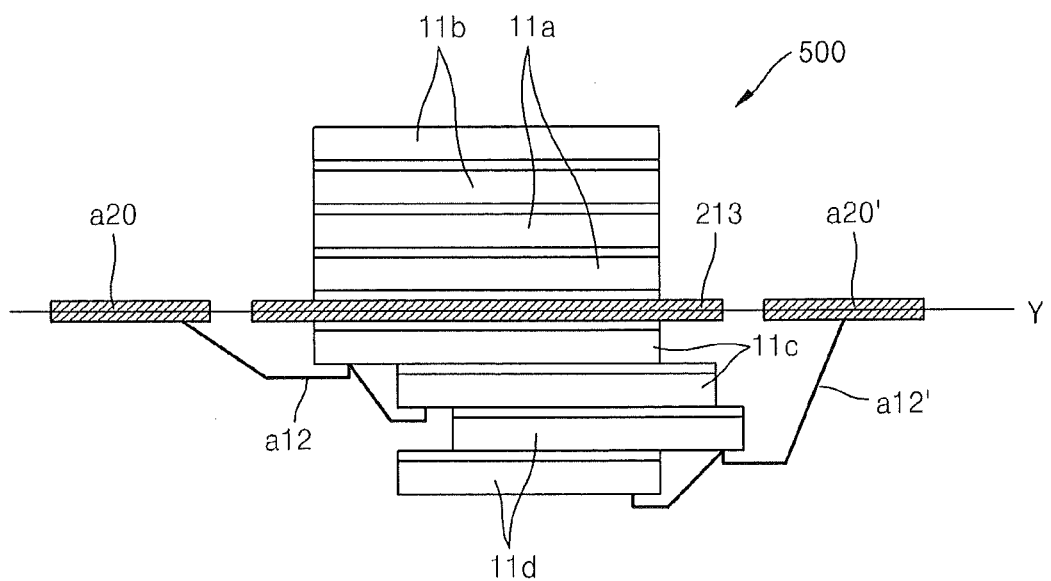
FIG. 16 is a front cross-sectional view of FIG. 15.
Figure 17:
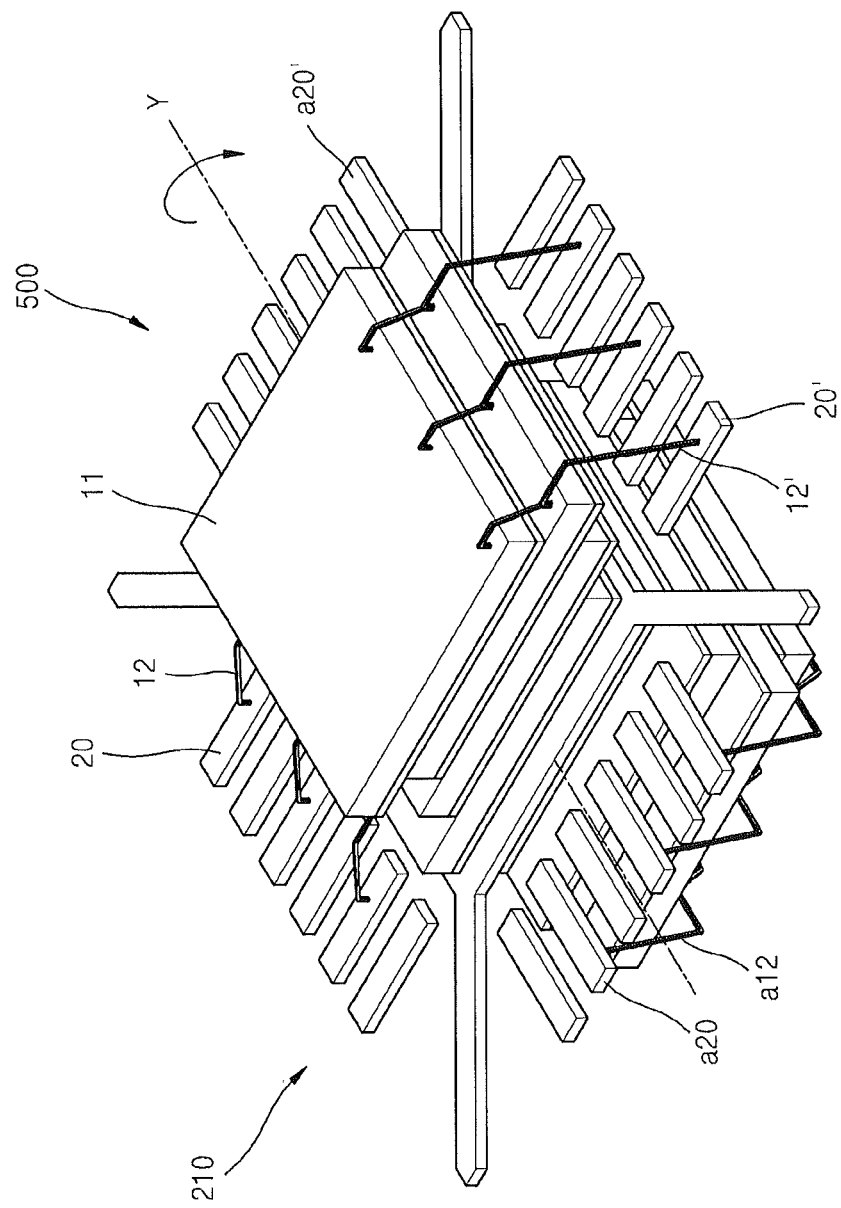
FIG. 17 is a perspective view illustrating the stacked structure of semiconductor chips in the semiconductor package of FIG. 16.
Figure 18:
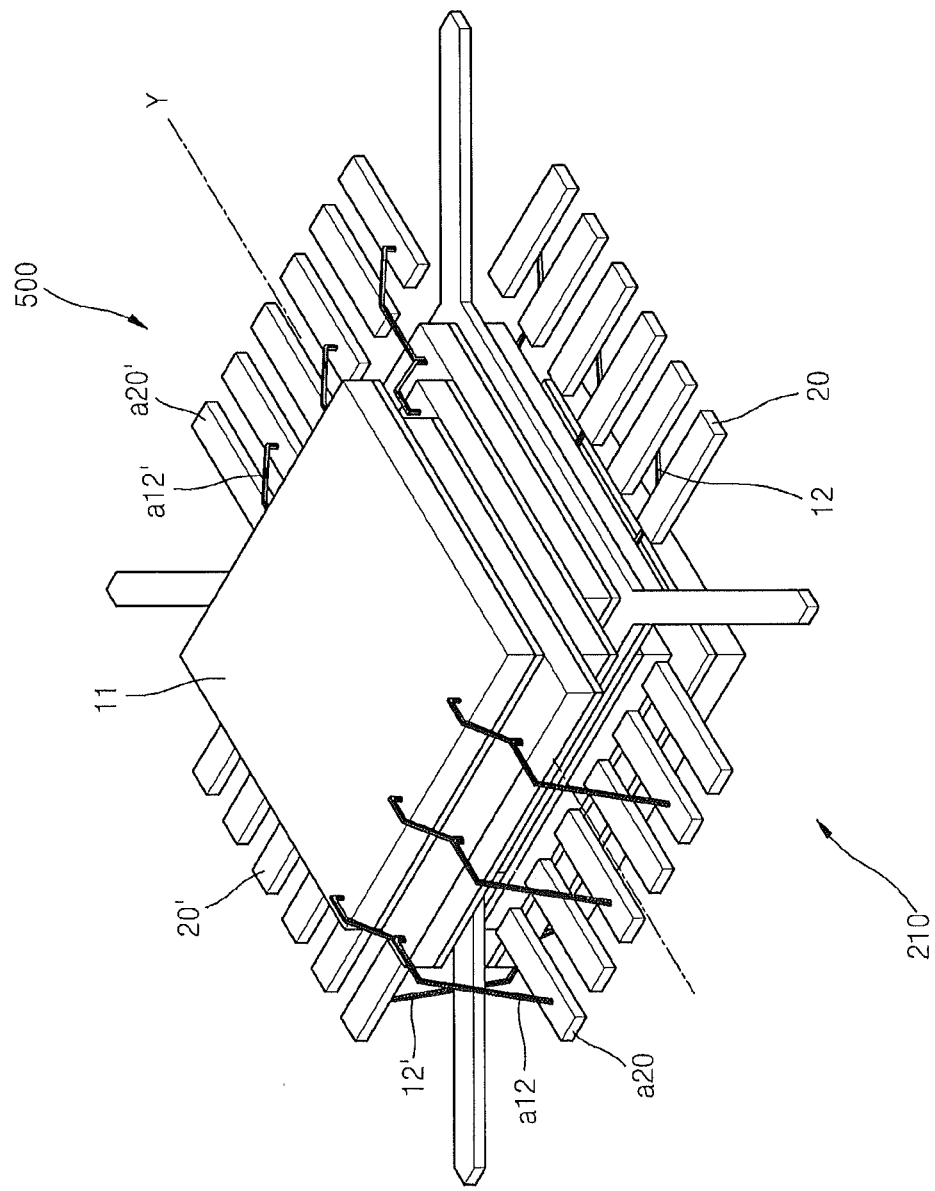
FIG. 18 is a perspective view of the semiconductor package of FIG. 17 that is rotated by 180 degrees with respect to the Y-axis.

FIG. 11 is a plane view illustrating the pin arrangement of a semiconductor package 500. FIG. 12 is a diagram illustrating a semiconductor package 500 of FIG. 11 in signal communication with a four-channel controller. FIG. 13 is a diagram illustrating in detail an example of the diagram of FIG. 12. FIG. 14 is a diagram illustrating a semiconductor package 500 of FIG. 11 in signal communication with an eight-channel controller. FIG. 15 is a side cross-sectional view illustrating an example of a stacked structure of semiconductor chips in the semiconductor package 500 of FIG. 11, FIG. 16 is a front cross-sectional view of FIG. 15. FIG. 17 is a perspective view illustrating the stacked structure of semiconductor chips in the semiconductor package 500 of FIG. 16. FIG. 18 is a perspective view of the semiconductor package 500 of FIG. 17 that is rotated by 180 degrees with respect to the Y-axis.

As illustrated in FIG. 11, FIG. 15, FIG. 16, FIG. 17, and FIG. 18, four major side surfaces, i.e., the left, right, top and bottom side edges (as referenced from a top down view of the package, such as in FIG. 11), of the semiconductor package 500 may be used. The semiconductor package 500 includes the semiconductor chip 11 protected by an encapsulant 110, and a plurality of leads that are connected to the semiconductor chips 11 and exposed to the outside. Referencing FIGS. 11 and 12, the plurality of leads are divided into a first pin group 20 that is exposed on the left edge side of the semiconductor package 500 and are connected to first channel lines 3a of a controller 3; a second pin group 20' that is exposed on the right edge side of, the semiconductor package 500 and are connected to second channel lines 3b of the controller 3; a third pin group a20 that is exposed on the bottom edge of the semiconductor package 500 and third channel lines 3c of the controller 3; and a fourth pin group a20' that is exposed on the top edge of the semiconductor package 500 and is connected to fourth channel lines 3d of the controller 3.

As illustrated in FIGS. 15 to 18, the plurality of the semiconductor chips 11 are divided into a first semiconductor chip group 11a connected to the first lead group 20 by wires 12, a second semiconductor chip group 11b connected to the second lead group 20' by second wires 12', a third semiconductor chip group 11c connected to the third lead group a20 by third wires a12, and a fourth semiconductor chip group 11d connected to the fourth lead group a20' by fourth wires a12'. In this example, each of the lead groups are dedicated to their corresponding chip group and are not shared with chips of other chip groups. Each lead group includes at least some leads which are shared among the chips of that lead group. Finally, each lead group may have certain leads which are dedicated to one chip or only a portion of the chips of the lead group. The relationship between the leads and associated lead group may be the same as that discussed above with respect to the embodiment of FIG. 1 of this disclosure.

In the first semiconductor chip group 11a, a plurality of the semiconductor chips may be stacked on a die paddle 13 in a first-direction stepwise fashion (for example, they are stacked upward in a stepwise fashion toward a right direction). In the second semiconductor chip group 11b, a plurality of the semiconductor chips 11 may be stacked on the first semiconductor chip group 11a in a second-direction stepwise fashion (for example, they are stacked upward in a stepwise fashion toward a left direction). In the third semiconductor chip group 110, a plurality of the semiconductor chips 11 may be stacked below the die paddle 13 in a third-direction stepwise fashion (for example, they are stacked downward in a stepwise fashion toward a front direction). In the fourth semiconductor chip group 11d, a plurality of the semiconductor chips 11 may be stacked below the third semiconductor chip group 11c in a fourth-direction stepwise fashion (for example, they are stacked downward toward a rear direction).

Thus, as illustrated in FIGS. 12 and 13, when a four-channel controller 3 is connected to the semiconductor package 500, first channel lines 3a, second channel lines 3b, third channel lines 3c, and fourth channel lines 3d may be connected to the first pin group 20, the second pin group 20', the third pin group a20 and the fourth pin group a20' of the semiconductor package 500, respectively. That is, the four-channel controller 3 may communicate along all four channels to one of the semiconductor package 500. Each of the four channels of the four channel controller corresponds to a chip group (20, 20', a20, a20') of the package 500. Some of the channels lines of the channel may be shared (e.g., I/O lines), others may be dedicated (e.g., those lines that are dedicated to portions of a chip group, such as chip enable (CE including nCE), RE (reset), CLE (clock enable), power (Vcc) and/or ground power (Vss).

As illustrated in FIG. 14, an eight-channel controller 3 is connected to two semiconductor packages 500, with first channel lines 3a, second channel lines 3b, third channel lines 3c, and fourth channel lines 3d connected to one of the semiconductor package 500, and fifth channel lines 3e, sixth channel lines 3f, seventh channel lines 3g, and eighth channel lines 3h connected to another of the semiconductor package 500. That is, the eight-channel controller 3 may correspond to two of the semiconductor packages 500.

That is, when one of the semiconductor packages 500 is connected to a controller having a plurality of channels, it is possible to greatly reduce the total number of the semiconductor packages 500 to be mounted so that the number of packages 500 is less than the number of channels used by the controller or less than the number of channels available on the controller.

Figure 22:
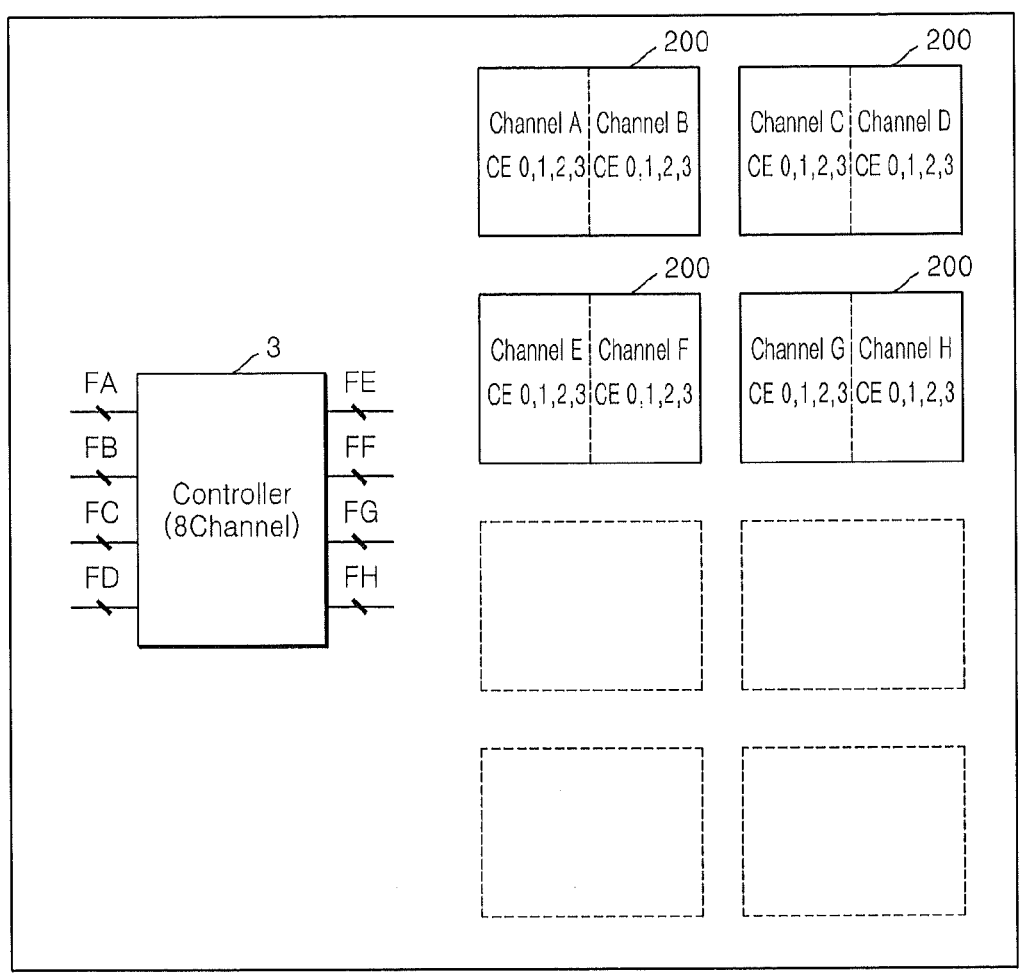
FIG. 22 is a diagram illustrating a case where four semiconductor packages are necessary to drive an eight-channel controller when each of the semiconductor packages has two lead groups, according to yet another example of the disclosure.
Figure 24:
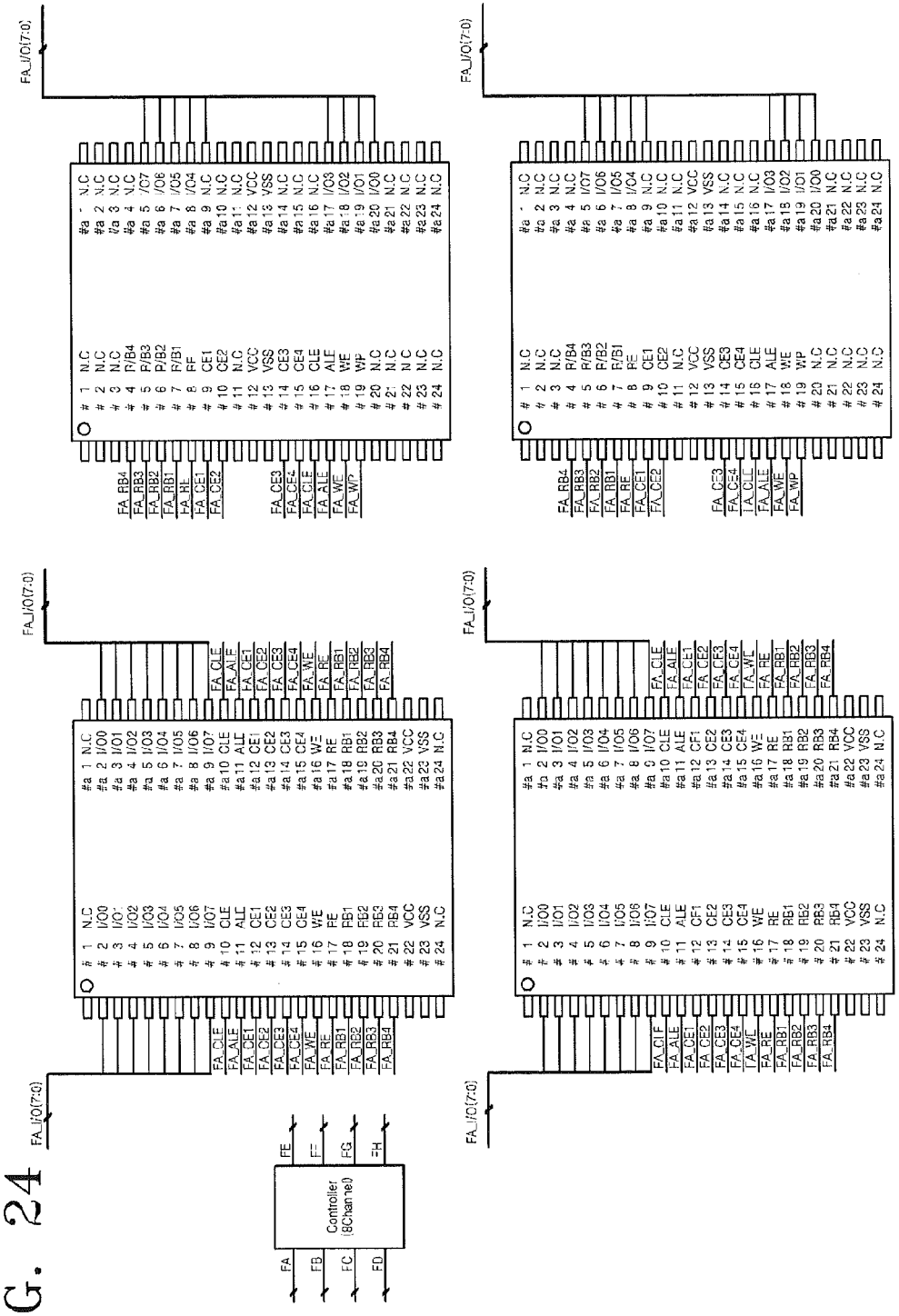
FIG. 24 is a diagram illustrating in detail an example of FIG. 22.

FIGS. 22 and 24 illustrate an example where a controller 3 is an eight channel controller having channel connections to four packages, each package connected to two of channels FA, FB, FC, FD, FE, FF, FG and FH. In this example and the above examples, each channel may have a plurality of sub-channels, each sub-channel identified by a single CE line or pin, whether the CE is connected to a single chip or to multiple chips acting as a single chip by virtue of their shared CE connection and distinctive address decoding as discussed above.

Figure 19:
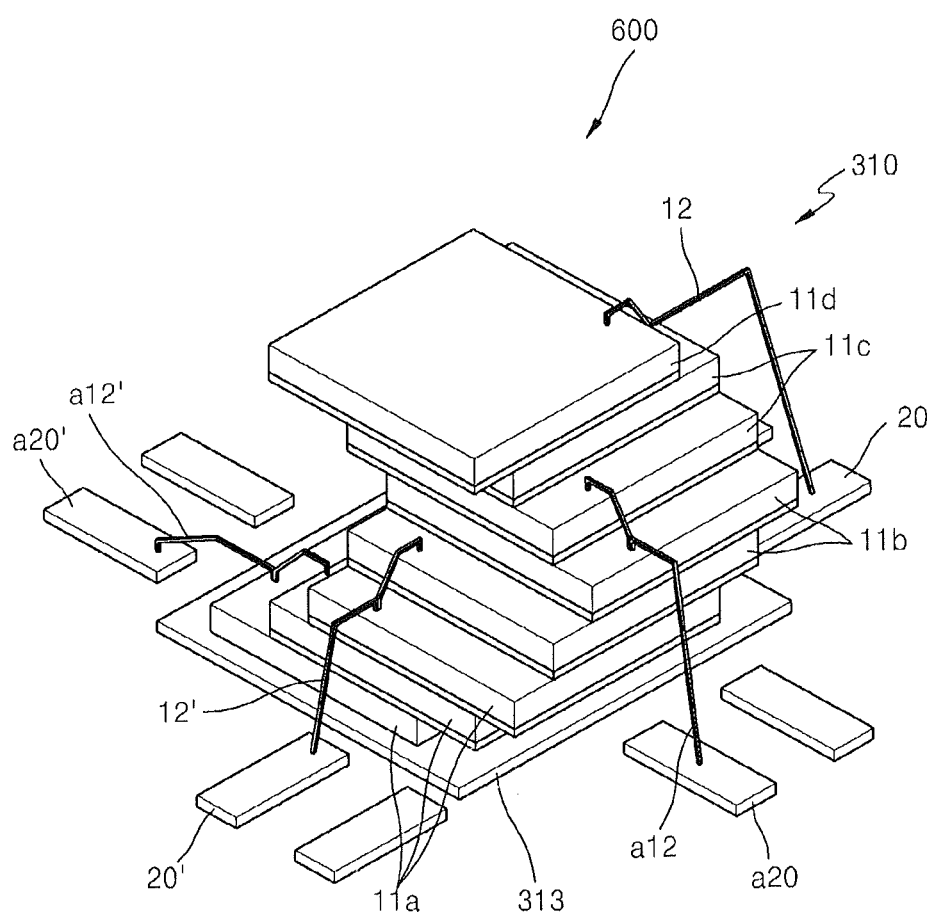
FIG. 19 is a perspective view of a stacked structure of semiconductor chips of a semiconductor package according to yet another example.
Figure 20:
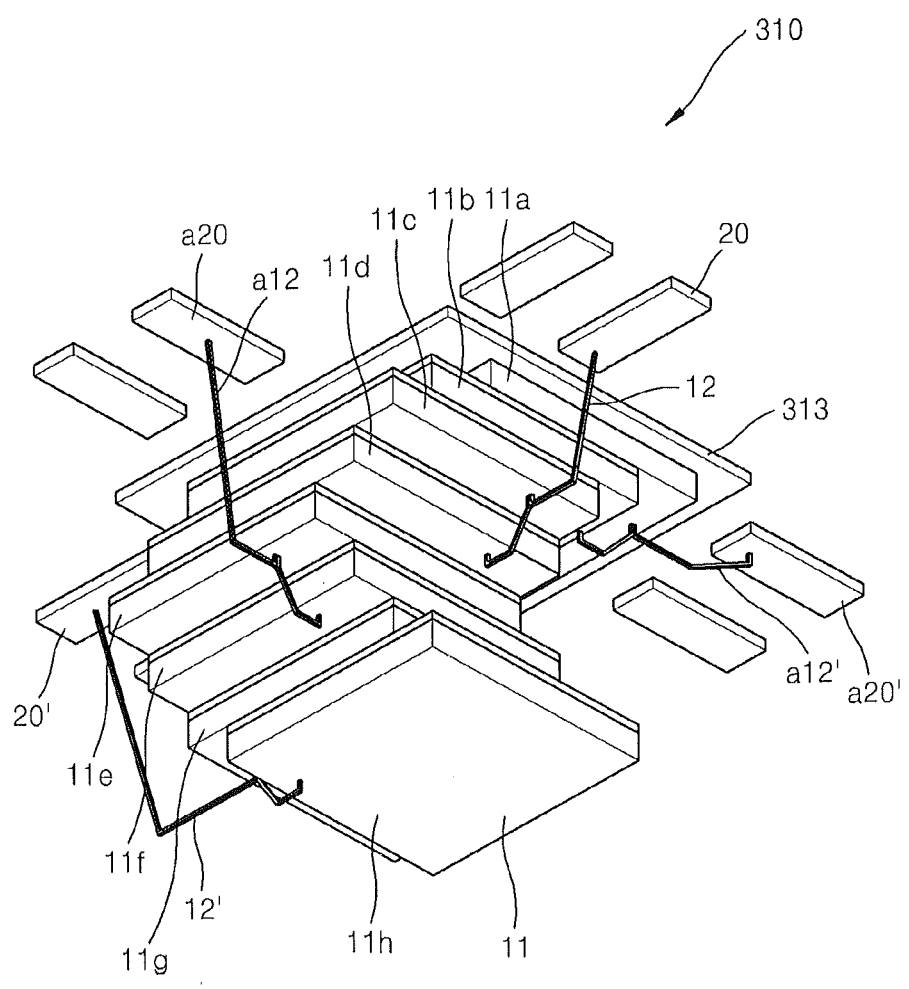
FIG. 20 is a bottom perspective view of FIG. 19.

FIG. 19 is a perspective view of a stacked structure of the semiconductor chips 11 of a semiconductor package 600, FIG. 20 is a bottom perspective view of FIG. 19.

As illustrated in FIGS. 19 and 20, in the semiconductor package 600, a plurality of the semiconductor chips 11 are divided into a first semiconductor chip group 11a, a second semiconductor chip group 11b, a third semiconductor chip group 11c, and a fourth semiconductor chip group 11d.

In the first semiconductor chip group 11a, a plurality of the semiconductor chips 11 may be stacked on a die paddle 13 in a first-direction stepwise fashion (for example, they are stacked upward in a stepwise fashion, in a right direction). In the second semiconductor chip group 11b, a plurality of the semiconductor chips 11 may be stacked on the first semiconductor chip group 11a in a second-direction stepwise fashion (for example, they are stacked upward in a stepwise fashion, in a front direction). In the third semiconductor chip group 11c, a plurality of the semiconductor chips 11 may be stacked on the second semiconductor chip group 11b in a third-direction stepwise fashion (for example, they are stacked downward in a stepwise fashion, in a left direction). In the fourth semiconductor chip group 11d, a plurality of the semiconductor chips 11 may be stacked on the third semiconductor chip group 11c in a fourth-direction stepwise fashion (for example, they are stacked downward, in a rear direction).

That is, the first to fourth semiconductor chip groups 11a to 11d of the semiconductor package 600 may be continuously stacked on the die paddle 313 in the right, front, left, and rear directions of the semiconductor package 600, i.e., in a whirling stepped pattern or spiral shaped stepped pattern.

As noted above, the embodiments of described herein have been exemplified, by using pins as package terminals. However, terminals other than pins may be used, such as solder balls, or solder bumps. In such a case, it may be preferred to use a package substrate other than a die paddle, such as a PCB based substrate with leads on or embedded within the substrate. Wire bonds or other connections to the chip pads (such as through silicon vias) may provide an electrical connection to the leads, and further connections may be made to the terminals of the package (e.g., solder balls) via the leads embedded in the package substrate.

Further, in the above embodiments, leads and pins of a first chip group are dedicated to that chip group. However, it is contemplated that variations of the above may include some leads and pins which are shared between multiple chip groups or all chip groups of a package. For example, power and voltage connections such as Vss, ground, and positive voltages (Vcc, Vdd and Vpp, e.g.,) may be shared between multiple chip groups within the package within the spirit of this disclosure.

In the examples discussed in detail above, I/O pins I/O0 to I/O7 are used to transmit data, address and command information. However, dedicated package terminals may be provided for one or more of data, address and command signaling. For example, data pins may be separate and discrete from address/command pins. Implementation will likely vary in dependence on the type of chip and associated chip pad functions.

In certain examples described above, chip groups comprise multiple chips. However, the examples are not limited to chip groups having multiple chips. A chip group may have only one chip. Furthermore, chip groups may have chips of different numbers. Thus one chip group of a package may consist of only one chip, while other chip groups of the package may comprise plural chips.

It will be appreciated by those skilled in the art that the above discussion is for demonstration purpose; and the examples discussed above are some of many possible examples. Other variations are also applicable. For example, the semiconductor chips can be stacked in many other possible ways; and the signals can be delivered to the semiconductor chips through other ways, such as through-electrodes, may be used instead of the above wires 12, 12', a12, and a12', and solder balls may be used instead of the above leads.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general, inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

We claim:

1. A semiconductor package comprising:
   a packaging substrate including a plurality of terminals on the packaging substrate, the plurality of terminals including,
   a first group of terminals configured to receive respective channel lines of a first channel from a controller, wherein the first group of terminals includes a chip enable terminal configured to receive a chip enable channel line of the first channel from the controller, and
   a second group of terminals configured to receive respective channel lines of a second channel from the controller;
   a first semiconductor chip group on the packaging substrate, wherein the first semiconductor chip group includes a first plurality of semiconductor chips electrically connected to terminals of the first group of terminals;
   a second semiconductor chip group on the packaging substrate, wherein the second semiconductor chip group includes a second plurality of semiconductor chips electrically connected to terminals of the second group of terminals; and
   a chip enable signal line providing electrical connection between the chip enable terminal and first and second semiconductor chips of the first plurality of semiconductor chips.

2. The semiconductor package of claim 1 wherein the second group of terminals includes a second chip enable terminal configured to receive a chip enable channel line of the second channel from the controller, the semiconductor package further comprising:
   a second chip enable signal line providing electrical connection between the chip enable terminal and first and second semiconductor chips of the second semiconductor chip group.

3. The semiconductor package of claim 1 wherein the first group of terminals includes a second chip enable terminal configured to receive a second chip enable channel line of the first channel from the controller, the semiconductor package further comprising:
   a second chip enable signal line providing electrical connection between the second chip enable terminal and third and fourth semiconductor chips of the first semiconductor chip group.

4. The semiconductor package of claim 3 wherein the first group of terminals includes an input/output terminal configured to receive an input/output channel line of the first channel from the controller, the semiconductor package further comprising:
   an input/output signal line providing electrical connection between the input/output terminal and the first, second, third, and fourth semiconductor chips of the first semiconductor chip group.

5. The semiconductor package of claim 1 wherein the controller comprises a memory controller, wherein the first plurality of semiconductor chips of the first semiconductor chip group comprise a first plurality of semiconductor memory chips, and wherein the second plurality of semiconductor chips of the second semiconductor chip group comprise a second plurality of semiconductor memory chips.

6. The semiconductor package of claim 5,
   wherein the first group of terminals includes a plurality of input/output terminals configured to receive respective input/output channel lines of the first channel, a read/busy terminal configured to receive a read/busy channel line of the first channel, and a write protect terminal configured to receive a write protect channel line of the first channel, and
   wherein the second group of terminals includes a chip enable terminal configured to receive a chip enable channel line of the second channel, a plurality of input/output terminals configured to receive respective input/output channel lines of the second channel, a read/busy terminal configured to receive a read/busy channel line of the second channel, and a write protect terminal configured to receive a write protect channel line of the second channel.

7. The semiconductor package of claim 1 wherein portions of the terminals of the first and second groups of terminals are exposed outside the semiconductor package.

8. The semiconductor package of claim 1 wherein the chip enable signal line comprises a wire bond, 9. The semiconductor package of claim 1, wherein the controller comprises a memory controller, wherein the first semiconductor chip group includes four semiconductor memory chips, wherein the second semiconductor chip group includes four semiconductor memory chips, wherein the first group of terminals includes a second chip enable terminal configured to receive a second chip enable channel line of the first channel from the memory controller, wherein the second group of terminals includes first and second chip enable terminals configured to receive respective first and second chip enable channel lines of the second channel from the memory controller, the semiconductor package further comprising:
   a second chip enable signal line providing electrical connection between the second chip enable terminal of the first group of terminals and third and fourth semiconductor memory chips of the first semiconductor chip group;
   a third chip enable signal line providing electrical connection between the first chip enable terminal of the second group of terminals and first and second semiconductor memory chips of the second semiconductor chip group; and
   a fourth chip enable signal line providing electrical connection between the second chip enable terminal of the second group of terminals and third and fourth semiconductor memory chips of the second semiconductor chip group.

10. The semiconductor package of claim 9 wherein the first group of terminals includes an input/output terminal configured to receive an input/output channel line of the first channel from the memory controller, and wherein the second group of terminals includes an input/output terminal configured to receive an input/output channel line of the second channel from the memory controller, the semiconductor package further comprising:
    first input/output signal line providing electrical connection between the input/output terminal of the first group of terminals and each of the first, second, third, and fourth semiconductor memory chips of the first plurality of semiconductor memory chips; and a second input/output signal line providing electrical connection between the input/output terminal of the second group of terminals and each of the first, second, third, and fourth semiconductor memory chips of the first plurality of semiconductor memory chips.

11. A semiconductor memory comprising:

a packaging substrate including a chip enable terminal configured to receive a first chip enable channel line from a memory controller; and first and second semiconductor memory chips on the packaging substrate, wherein an electrical connection is provided between the chip enable terminal and each of the first and second semiconductor memory chips.

12. The semiconductor memory of claim 11 wherein the chip enable terminal is a first chip enable terminal, wherein the electrical connection is a first electrical connection, wherein the packaging substrate further includes a second chip enable terminal configured to receive a second chip enable channel line from the memory controller, the semiconductor memory further comprising:

a third semiconductor memory chip on the packaging substrate, wherein a second electrical connection is provided between the second chip enable terminal and the third semiconductor memory chip.

13. The semiconductor memory of claim 12 wherein the packaging substrate further includes a first input/output terminal configured to receive a first input/output channel line from the memory controller and a second input/output terminal configured to receive a second input/output channel line from the memory controller, wherein a third electrical connection is provided between the first input/output terminal and each of the first and second semiconductor memory chips, wherein the first and second semiconductor memory chips are free of electrical coupling with the second input/output terminal, wherein a fourth electrical connection is provided between the second input/output terminal and the third semiconductor memory chip, and wherein the third semiconductor memory chip is free of electrical coupling with the first input/output terminal.

14. The semiconductor memory of claim 13 further comprising:

a fourth semiconductor memory chip on the packaging substrate, wherein the second electrical connection is provided between the second chip enable terminal and the third and fourth semiconductor memory chips, and wherein the fourth electrical connection is provided between the second input/output terminal and the third and fourth semiconductor memory chips.

15. The semiconductor memory of claim 14 wherein the packaging substrate further includes a third chip enable terminal configured to receive a third chip enable channel line from the memory controller, the semiconductor memory further comprising:

fifth and sixth semiconductor memory chips on the packaging substrate, wherein a fifth electrical connection is provided between the third chip enable terminal and each of the fifth and sixth semiconductor memory chips, and wherein the third electrical connection is provided between the first input/output terminal and each of the first, second, fifth, and sixth semiconductor memory chips.

16. The semiconductor memory of claim 12 wherein the first chip enable channel line comprises a channel line of a first channel from the memory controller, and wherein the second chip enable channel line comprises a channel line of a second channel from the memory controller.

17. The semiconductor memory of claim 16 wherein the packaging substrate further comprises a first plurality of input/output terminals configured to receive respective input/output channel lines of the first channel and electrically connected to the first and second semiconductor memory chips, and a second plurality of input/output terminals configured to receive respective input/output channel lines of the second channel and electrically connected to the third semiconductor memory chip.

18. The semiconductor memory of claim 17 wherein the packaging substrate further comprises a first read/busy terminal configured to receive a read/busy channel line of the first channel and electrically connected to the first and second semiconductor memory chips, and a first write protect terminal configured to receive a write protect channel line of the first channel and electrically connected to the first and second semiconductor memory chips, a second read/busy terminal configured to receive a read/busy channel line of the second channel and electrically connected to the third semiconductor memory chip, and a second write protect terminal configured to receive a write protect channel line of the second channel and electrically connected to the third semiconductor memory chip.

19. The semiconductor memory of claim 11 wherein the first semiconductor memory chip is between the second semiconductor memory chip and the packaging substrate.

20. A semiconductor memory system comprising:

a memory controller; and a semiconductor memory coupled with the memory controller, the semiconductor memory comprising, a packaging substrate including a first chip enable terminal configured to receive a first chip enable channel line from the memory controller, and a second chip enable terminal configured to receive a second chip enable channel line from the memory controller, a first and second semiconductor memory chips on the packaging substrate, wherein a first electrical connection is provided between the first chip enable terminal and each of the first and second semiconductor memory chips, and a third semiconductor memory chip on the packaging substrate, wherein a second electrical connection is provided between the second chip enable terminal and the third semiconductor memory chip.

* * * * *